United States Patent
Narita et al.

(10) Patent No.: US 12,480,047 B2
(45) Date of Patent: Nov. 25, 2025

(54) COMPOSITION AND METHOD FOR TREATING SUBSTRATE

(71) Applicant: FUJIFILM Corporation, Tokyo (JP)

(72) Inventors: Moe Narita, Shizuoka (JP); Atsushi Mizutani, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 93 days.

(21) Appl. No.: 17/825,722

(22) Filed: May 26, 2022

(65) Prior Publication Data

US 2022/0282156 A1 Sep. 8, 2022

Related U.S. Application Data

(63) Continuation of application No. PCT/JP2021/000158, filed on Jan. 6, 2021.

(30) Foreign Application Priority Data

Jan. 28, 2020 (JP) .................. 2020-011382

(51) Int. Cl.
| | | |
|---|---|---|
| C09K 13/06 | (2006.01) | |
| H01L 21/02 | (2006.01) | |
| H01L 21/3213 | (2006.01) | |

(52) U.S. Cl.
CPC ........ C09K 13/06 (2013.01); H01L 21/02071 (2013.01); H01L 21/02074 (2013.01); H01L 21/02087 (2013.01); H01L 21/0209 (2013.01); H01L 21/02244 (2013.01); H01L 21/32135 (2013.01)

(58) Field of Classification Search
CPC .............. C09K 13/06; H01L 21/02071; H01L 21/02074; H01L 21/02087; H01L 21/0209; H01L 21/02244; H01L 21/32135; H01L 23/53242; H01L 21/02063; H01L 21/76814; H01L 21/32134; H01L 21/02057; H01L 21/31111; C23F 1/18; C23F 1/28; C23F 1/30; C11D 3/30; C11D 3/3942; C11D 2111/22

See application file for complete search history.

(56) References Cited

U.S. PATENT DOCUMENTS

| | | | | |
|---|---|---|---|---|
| 6,313,039 | B1 * | 11/2001 | Small ................. | C09K 13/00 |
| | | | | 106/3 |
| 2002/0111024 | A1 * | 8/2002 | Small ................. | C09G 1/02 |
| | | | | 438/689 |

(Continued)

FOREIGN PATENT DOCUMENTS

| | | | | |
|---|---|---|---|---|
| EP | 3702425 A1 * | 9/2020 | ............... | B24B 1/00 |
| JP | 2016-092101 A | 5/2016 | | |

(Continued)

OTHER PUBLICATIONS

TW-201335346-A, Machine Translation. (Year: 2024).*

(Continued)

*Primary Examiner* — Binh X Tran
*Assistant Examiner* — Christopher Remavege
(74) *Attorney, Agent, or Firm* — Sughrue Mion, PLLC

(57) ABSTRACT

A composition contains a periodic acid compound selected from the group consisting of a periodic acid and a salt thereof, an amine compound that is a specific compound represented by Formula (1) or a salt thereof, and water.

17 Claims, 3 Drawing Sheets

(56) References Cited

U.S. PATENT DOCUMENTS

| | | | | |
|---|---|---|---|---|
| 2005/0101134 A1* | 5/2005 | Brask | ............... | H01L 21/32134 |
| | | | | 257/E21.309 |
| 2013/0303420 A1* | 11/2013 | Cooper | .................. | C11D 3/046 |
| | | | | 510/175 |
| 2015/0210966 A1* | 7/2015 | Shimada | ................. | G03F 7/423 |
| | | | | 510/176 |
| 2016/0200975 A1* | 7/2016 | Cooper | ............. | H01L 21/31111 |
| | | | | 216/13 |
| 2017/0222138 A1 | 8/2017 | Park et al. | | |
| 2017/0240850 A1* | 8/2017 | Oie | ....................... | H01L 21/308 |
| 2018/0323151 A1* | 11/2018 | Briggs | .............. | H01L 21/76865 |
| 2020/0347299 A1 | 11/2020 | Takahashi et al. | | |
| 2020/0354632 A1 | 11/2020 | Sugimura et al. | | |
| 2021/0155851 A1* | 5/2021 | Ohhashi | ............ | H01L 21/30604 |

FOREIGN PATENT DOCUMENTS

| | | | | | |
|---|---|---|---|---|---|
| TW | 201335346 A | * | 9/2013 | ............... | B24B 1/00 |
| TW | 201934805 A | | 9/2018 | | |
| WO | 2016/068183 A1 | | 5/2016 | | |
| WO | 2019/138814 A1 | | 7/2019 | | |
| WO | 2019/150990 A1 | | 8/2019 | | |

OTHER PUBLICATIONS

Office Action dated Jul. 4, 2023 in Japanese Patent Application No. 2021-574574.
International Search Report dated Apr. 6, 2021 in International Application No. PCT/JP2021/000158.
International Preliminary Report on Patentability dated Jul. 28, 2022 in International Application No. PCT/JP2021/000158.
Written Opinion of the International Searching Authority dated Apr. 6, 2021 in International Application No. PCT/JP2021/000158.
Communication dated Jun. 11, 2024 issued by the Taiwanese Patent Office in Taiwanese application No. 110101150.
Office Action issued Jun. 25, 2024 in Korean Application No. 10-2022-7017363.
Office Action issued Feb. 12, 2025 in Korean Application No. 10-2022-7017363.
Office Action issued Feb. 8, 2025 in Taiwanese Application No. 110101150.
Office Action dated Aug. 7, 2025, issued in Taiwanese application No. 110101150.

* cited by examiner

COMPOSITION AND METHOD FOR TREATING SUBSTRATE

CROSS-REFERENCE TO RELATED APPLICATIONS

This application is a Continuation of PCT International Application No. PCT/JP2021/000158 filed on Jan. 6, 2021, which claims priority under 35 U.S.C. § 119(a) to Japanese Patent Application No. 2020-011382 filed on Jan. 28, 2020. Each of the above application(s) is hereby expressly incorporated by reference, in its entirety, into the present application.

BACKGROUND OF THE INVENTION

1. Field of the Invention

The present invention relates to a composition and a method for treating a substrate.

2. Description of the Related Art

As the miniaturization of semiconductor products progresses, there is an increasing demand for performing a step of removing unnecessary metal-containing substances on a substrate in a semiconductor product manufacturing process with high efficiency and high accuracy.

WO2019/138814A describes an invention relating to a chemical liquid that is used for removing a transition metal-containing substance on a substrate and contains one or more kinds of periodic acids selected from the group consisting of a periodic acid and a salt thereof and a compound containing one or more kinds of anions selected from the group consisting of $IO_3^-$, $I^-$, and $I^{3-}$ at specific contents.

SUMMARY OF THE INVENTION

In recent years, a composition that is used as an etchant for removing unnecessary metal-containing substances on a substrate has been required to exhibit a higher dissolving ability (etching performance) to the metal-containing substances. Particularly, there has been a demand for a composition that demonstrates excellent etching performance to an object to be treated having a ruthenium (Ru)-containing substance.

Incidentally, in a step such as a substrate treatment performed before a step of removing a metal-containing substance, sometimes the metal-containing substance is oxidized from the surface thereof and forms an oxide. Although the etchant used in the related art has a dissolving ability for a target metal-containing substance, it can't be said that this etchant always has a dissolving ability for an oxide of a metal contained in the metal-containing substance. Therefore, there is a demand for a composition that also has a sufficient dissolving ability for a substance containing such an oxidized metal (particularly, ruthenium oxide ($RuO_2$)).

An object of the present invention is to provide a composition that has an excellent dissolving ability to both the metal-containing substance (particularly, a Ru-containing substance) and oxidized metal-containing substance (particularly, a $RuO_2$-containing substance).

Another object of the present invention is to provide a method for treating a substrate by using the composition.

In order to achieve the above object, the inventors of the present invention carried out intensive studies. As a result, the inventors have found that the objects can be achieved by the following constitution.

[1]
A composition containing a periodic acid compound selected from the group consisting of a periodic acid and a salt thereof, an amine compound that is a compound represented by Formula (1) which will be described later or a salt thereof, and water.

[2]
The composition described in [1], in which the composition is a composition for treating a substrate having a substance selected from the group consisting of a ruthenium-containing substance and a ruthenium oxide-containing substance.

[3]
The composition described in [1], in which the composition is a composition for treating a substrate having a ruthenium-containing substance and a ruthenium oxide-containing substance.

[4]
The composition described in any one of [1] to [3], in which the amine compound has 1 to 8 carbon atoms.

[5]
The composition described in any one of [1] to [4], in which an aliphatic hydrocarbon group represented by R has a substituent and further has a functional group selected from the group consisting of a carboxy group, an amino group, an oxo group, a phosphonic acid group, and a sulfo group.

[6]
The composition described in any one of [1] to [5], in which the amine compound is at least one kind of compound selected from the group consisting of β-alanine, 4-aminobutyric acid, 5-aminovaleric acid, 1,3-propanediamine, 1,4-butanediamine, 1,6-hexanediamine, succinic acid amide, malonamide, propanamide, butyramide, and adipamide.

[7]
The composition described in any one of [1] to [6], in which a ratio of a content of the periodic acid compound to a content of the amine compound is 1 to 95 as a mass ratio.

[8]
The composition described in any one of [1] to [7], in which the composition has a pH of 10.0 or less.

[9]
The composition described in any one of [1] to [8], in which the composition has a pH of 3.5 or more.

[10]
The composition described in any one of [1] to [9], in which the composition has a pH of 3.5 to 6.0.

[11]
The composition described in any one of [1] to [10], in which the composition substantially does not contain abrasive particles.

[12]
A method for treating a substrate, including a step A of removing a substance selected from the group consisting of a metal-containing substance and an oxidized metal-containing substance on a substrate by using the composition described in any one of [1] to [11].

[13]
The method for treating a substrate described in [12], in which the metal-containing substance includes a ruthenium-containing substance, and the oxidized metal-containing substance includes a ruthenium oxide-containing substance.

[14]
The method for treating a substrate described in [12] or [13], in which the step A is a step A1 of performing a recess etching treatment by using the composition on a wiring line that is disposed on a substrate and consists of a metal-containing substance or an oxidized metal-containing substance, a step A2 of removing a film in an outer edge portion of a substrate by using the composition, the substrate having the film consisting of a metal-containing substance or an oxidized metal-containing substance disposed thereon, a step A3 of removing a metal-containing substance or an oxidized metal-containing substance attached to a back surface of a substrate by using the composition, the substrate having a film consisting of a metal-containing substance or an oxidized metal-containing substance disposed thereon, a step A4 of removing a metal-containing substance or an oxidized metal-containing substance on a substrate having undergone dry etching by using the composition, or a step A5 of removing a metal-containing substance or an oxidized metal-containing substance on a substrate having undergone chemical mechanical polishing by using the composition.

[15]

The method for treating a substrate described in any one of [12] to [14], further having an oxidation treatment step of bringing an oxidant into contact with the metal-containing substance on the substrate, in which the step A is performed on the substrate having at least an oxidized metal-containing substance manufactured by the oxidation treatment step.

According to an aspect of the present invention, it is possible to provide a composition that has an excellent dissolving ability for both the metal-containing substance and oxidized metal-containing substance.

Furthermore, according to an aspect of the present invention, it is possible to provide a method for treating a substrate by using the composition.

DESCRIPTION OF THE PREFERRED EMBODIMENTS

Figure 1:
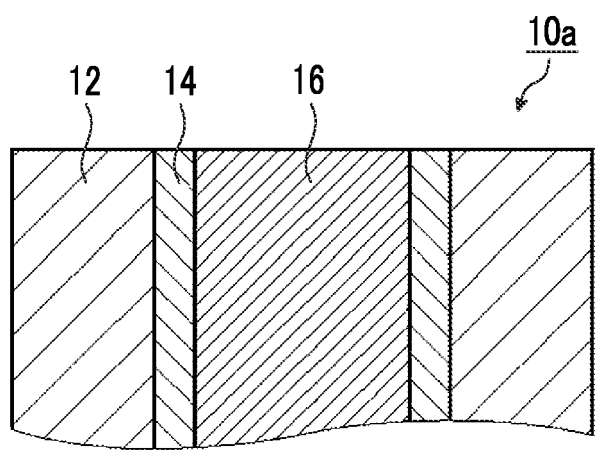
FIG. 1 is a schematic cross-sectional top view showing an example of an object to be treated used in a step A1.

Hereinafter, the present invention will be specifically described.

The following constituents will be described based on typical embodiments of the present invention in some cases, but the present invention is not limited to the embodiments.

In the present specification, in a case where there are two or more kinds of components corresponding to a certain component, "content" of such a component means the total content of the two or more kinds of components.

In the present specification, in a case where there is no description regarding whether a group (atomic group) is substituted or unsubstituted, as long as the effects of the present invention are not reduced, the group includes both the group having no substituent and the group having a substituent. For example, "alkyl group" includes not only an alkyl group having no substituent (unsubstituted alkyl group) but also an alkyl group having a substituent (substituted alkyl group). The same is true of each compound.

Unless otherwise specified, "exposure" in the present specification means not only the exposure performed using a bright line spectrum of a mercury lamp, far ultraviolet rays represented by excimer laser, X-rays, Extreme ultraviolet (EUV) light, and the like, but also the drawing performed using particle beams such as electron beams and ion beams.

In the present specification, a range of numerical values described using "to" means a range including numerical values listed before and after "to" as a lower limit and an upper limit.

In the present specification, unless otherwise specified, the term "metal" means a simple metal having not been oxidized, the term "metal-containing substance" means a material that contains a simple metal as a main component, and the term "oxidized metal-containing substance" means a material that contains an oxide of a metal as a main component. For example, regarding a metal-containing substance, "contains as a main component" means that the content of a simple metal (in a case where the metal-containing substance contains two or more simple metals or in a case where the metal-containing substance is an alloy, "content" means the total content thereof) is higher than the content of each of other components such as a metal oxide, a metal nitride, a metal oxynitrides, and a metal-free component.

[Composition]

The composition according to an embodiment of the present invention is a composition containing one or more kinds of periodic acid compounds selected from the group consisting of a periodic acid and a salt thereof, an amine compound that is a compound represented by Formula (1) which will be described later or a salt thereof (hereinafter, this amine compound will be also described as "specific amine" in the present specification), and water.

It is unclear through what mechanism the objects of the present invention are achieved by the use of the composition according to the embodiment of the present invention. According to the inventors of the present invention, presumably, containing the periodic acid compound, the composition may exhibit an excellent dissolving ability to a metal-containing substance, and because the specific amine contained in the composition together with the periodic acid compound forms a complex compound, the composition may exhibit an excellent dissolving ability to an oxidized metal-containing substance.

The composition according to the embodiment of the present invention has an excellent dissolving ability for both the metal-containing substance and oxidized metal-containing substance. Therefore, for example, in a case where the composition according to the embodiment of the present invention is used for treating a substrate, this composition can be preferably used for all of a substrate that has only a metal-containing substance, a substrate that has only an oxidized metal-containing substance, and a substrate that has both the metal-containing substance and oxidized metal-containing substance.

<Periodic Acid Compound>

The composition according to the embodiment of the present invention contains a periodic acid compound.

In the present specification, "periodic acid compound" is a generic term for compounds selected from the group consisting of a periodic acid and a salt thereof.

The periodic acid compound is not particularly limited. In view of excellent solubility of transition metal-containing substances represented by ruthenium, one or more kinds of compounds selected from the group consisting of orthoperiodic acid ($H_5IO_6$), a salt of orthoperiodic acid, metaperiodic acid ($HIO_4$), and a salt of metaperiodic acid are preferable, and orthoperiodic acid or metaperiodic acid is more preferable. Particularly, orthoperiodic acid is preferable because this compound does not contain an alkali metal such as sodium (Na) and the composition thereof is stable.

One kind of periodic acid compound may be used alone, or two or more kinds of periodic acid compounds may be used in combination.

In view of further improving the dissolving ability for a metal-containing substance, the content of the periodic acid compound with respect to the total mass of the composition is preferably 0.1% by mass or more, more preferably 0.5% by mass or more, even more preferable 1.5% by mass or more, and particularly preferably 2.0% by mass or more.

The upper limit of the content of the periodic acid compound is not particularly limited. The upper limit of the content of the periodic acid compound with respect to the total mass of the composition is preferably 40.0% by mass or less, more preferably 30.0% by mass or less, even more preferably 20.0% by mass or less, and particularly preferably 10.0% by mass or less.

<Specific Amine>

The composition according to the embodiment of the present invention contains an amine compound (specific amine) that is a compound represented by the following Formula (1) or a salt thereof.

$$R—NH_2 \quad \text{Formula (1)}$$

In Formula (1), R represents an aliphatic hydrocarbon group which may have a substituent. The aliphatic hydrocarbon group may have at least one linking group selected from the group consisting of —O—, —S— and —NR$_1$— in a carbon chain. R$_1$ represents a hydrogen atom or an aliphatic hydrocarbon group which may have a substituent. Here, the substituent that the aliphatic hydrocarbon group represented by R can have and the substituent that the aliphatic hydrocarbon group represented by R$_1$ can have do not include a hydroxy group.

The aliphatic hydrocarbon group represented by R may be linear, branched, or cyclic, or may have an unsaturated carbon bond. As the aliphatic hydrocarbon group, a linear or branched alkyl group or a cycloalkyl group is preferable, a linear or branched alkyl group is more preferable, and a linear alkyl group is even more preferable.

The number of carbon atoms of the aliphatic hydrocarbon group represented by R is not particularly limited, but is preferably 1 to 15, more preferably 1 to 8 in view of further improving the dissolving ability for a metal-containing substance (particularly a Ru-containing substance), even more preferably 1 to 7 in view of further improving the dissolving ability for an oxidized metal-containing substance (particularly a RuO$_2$-containing substance), still more preferably 2 to 7, particularly preferably 2 to 6 in view of further improving the dissolving ability for a metal-containing substance (particularly a Ru-containing substance) and an oxidized metal-containing substance (particularly a RuO$_2$-containing substance), and most preferably 3 to 6.

The substituent that the aliphatic hydrocarbon group represented by R has is not particularly limited as long as the substituent does not include a hydroxy group and an aromatic ring. Examples of the substituent include at least one kind of functional group selected from the group consisting of a carboxy group, an amino group, an oxo group, a phosphonic acid group, a sulfo group, and a mercapto group. The aliphatic hydrocarbon group represented by R preferably further has at least one of the above functional groups.

As the aforementioned functional group, a carboxy group, an amino group, an oxo group, a phosphonic acid group, or a sulfo group is preferable, and a carboxy group, an amino group, or an oxo group is more preferable.

The number of functional groups described above that the aliphatic hydrocarbon group represented by R has is not particularly limited, but is preferably 1 to 5 and more preferably 1 to 3.

R may be an aliphatic hydrocarbon group having a linking group selected from the group consisting of —O—, —S—, and —NR$_1$— in a carbon chain. R$_1$ represents a hydrogen atom or an aliphatic hydrocarbon group which may have a substituent.

The aliphatic hydrocarbon group represented by R$_1$ may be linear, branched, or cyclic, or may have an unsaturated carbon bond. The aliphatic hydrocarbon group represented by R$_1$ is more preferably a linear or branched alkyl group, and even more preferably a linear alkyl group.

The number of carbon atoms of the aliphatic hydrocarbon group represented by R$_1$ is not particularly limited, but is preferably 1 to 5 and more preferably 1 to 3.

As R$_1$, a hydrogen atom or a linear alkyl group having 1 to 3 carbon atoms is preferable, and a hydrogen atom is more preferable.

The number of the linking groups described above that the aliphatic hydrocarbon group represented by R has is not particularly limited, but is preferably 1 to 3 and more preferably 1 or 2.

It is preferable that the aliphatic hydrocarbon group represented by R do not have the aforementioned linking group in a carbon chain or have —NH—. It is more preferable that the aliphatic hydrocarbon group represented by R do not have the aforementioned linking group in a carbon chain.

The salt of the compound represented by Formula (1) is not particularly limited. Examples of such a salt include a salt with an inorganic acid that is formed in a case where at least one kind of nonmetal selected from the group consisting of Cl, S, N, and P is bonded to hydrogen. As such a salt, a hydrochloride, a sulfate, or a nitrate is preferable.

The number of carbon atoms of the specific amine is not particularly limited, but is preferably 1 to 15, more preferably 1 to 8 in view of further improving the dissolving ability for a metal-containing substance (particularly a Ru-containing substance), even more preferably 2 to 7 in view of further improving the dissolving ability for an oxidized metal-containing substance (particularly a RuO$_2$-containing substance), and particularly preferably 3 to 6 in view of further improving the dissolving ability for a metal-containing substance (particularly a Ru-containing substance) and an oxidized metal-containing substance (particularly a RuO$_2$-containing substance).

Specific examples of the specific amine will be shown below.

Examples of the specific amine having no substituent include methylamine, ethylamine, propylamine, n-butylamine, tert-butylamine, n-hexylamine, cyclohexylamine, n-octylamine, and 2-ethylhexylamine.

Examples of the specific amine in which the aliphatic hydrocarbon group represented by R has a carboxy group as a substituent include glycine, α-alanine (2-aminopropionic acid), β-alanine (3-aminopropionic acid), 4-aminobutyric acid, 5-aminovaleric acid, 7-aminoheptanoic acid, lysine, cysteine, asparagine, glutamine, and salts of these.

Examples of the specific amine in which the aliphatic hydrocarbon group represented by R has an amino group as a substituent, that is, the specific amine as a compound in which the total number of amino groups is 2 or more include alkylenediamine such as ethylenediamine, 1,3-propanediamine, 1,2-propanediamine, 1,3-butanediamine, 1,4-butanediamine, 1,5-pentanediamine, 2,2-dimethyl-1,3-propanediamine, 1,6-hexanediamine, 1,7-heptanediamine, and 1,8-octanediamine, and polyalkylpolyamine such as diethylenetriamine, bishexamethylenetriamine, triethylenetetramine, bis(aminopropyl)ethylenediamine, and tetraethylenepentamine.

Examples of the specific amine that has an acid amide structure due to an oxo group that the aliphatic hydrocarbon group represented by R has as a substituent include succinic acid amide, malonamide, propanamide, butyramide, adipamide, methyl carbamate, and urea.

Examples of the specific amine other than the above include 2-aminoethylphosphonic acid, taurine, aminomethanesulfonic acid, aminomethanephosphonic acid, N-methyl-1,3-propanediamine, N-ethylethylenediamine, and N-(2-aminoethyl)piperazine.

As the specific amines, β-alanine, 4-aminobutyric acid, 5-aminovaleric acid, 1,3-propanediamine, and 1,4-butanediamine, 1,6-hexanediamine, succinic acid amide, malonamide, propanamide, butyramide, adipamide, 2-aminoethylphosphonic acid, taurine, glycine, 7-aminoheptanoic acid, 1,8-octanediamine, aminomethanesulfonic acid, aminomethanephosphonic acid, or methyl carbamate is preferable in view of further improving the dissolving ability for a metal-containing substance (particularly a Ru-containing substance), and β-alanine, 4-aminobutyric acid, 5-aminovaleric acid, 1,3-propanediamine, 1,4-butanediamine, 1,6-hexanediamine, succinic acid amide, malonamide, propanamide, butyramide, adipamide, 2-aminoethylphosphonic acid, taurine, glycine or 7-aminoheptanoic acid is more preferable in view of further improving the dissolving ability for an oxidized metal-containing substance (particularly a $RuO_2$-containing substance).

Among these, in view of further improving the dissolving ability for a metal-containing substance (particularly a Ru-containing substance) and an oxidized metal-containing substance (particularly a $RuO_2$-containing substance), β-alanine, 4-aminobutyric acid, 5-aminovaleric acid, 1,3-propanediamine, 1,4-butanediamine, 1,6-hexanediamine, succinic acid amide, malonamide, propanamide, butyramide, or adipamide is even more preferable, and 4-aminobutyric acid, 1,3-propanediamine, or 1,4-butanediamine is particularly preferable.

One kind of specific amine may be used alone, or two or more kinds of specific amines may be used in combination.

In view of further improving the dissolving ability for an oxidized metal-containing substance (particularly a $RuO_2$-containing substance), the content of the specific amine with respect to the total mass of the composition is preferably 0.01% by mass or more, more preferably 0.05% by mass or more, and even more preferably more than 0.06% by mass. The upper limit of the content of the specific amine is not particularly limited. The upper limit of the content of the specific amine with respect to the total mass of the composition is preferably 30% by mass or less, more preferably 0.90% by mass or less in view of further improving the dissolving ability for an oxidized metal-containing substance (particularly a $RuO_2$-containing substance), and even more preferably 0.50% by mass or less.

The ratio of the content of the periodic acid compound to the content of the specific amine (content of periodic acid compound/content of specific amine) is preferably 200 or less in terms of a mass ratio. The ratio is more preferably 95 or less in terms of a mass ratio in view of further improving the dissolving ability for a metal-containing substance (particularly a Ru-containing substance), even more preferably 50 or less in terms of a mass ratio in view of further improving the dissolving ability for an oxidized metal-containing substance (particularly a $RuO_2$-containing substance), particularly preferably less than 45 in terms of a mass ratio in view of further improving the dissolving ability for a metal-containing substance (particularly a Ru-containing substance), and most preferably less than 40 in terms of a mass ratio in view of further improving the dissolving ability for an oxidized metal-containing substance (particularly a $RuO_2$-containing substance).

The lower limit of the ratio of the content described above is not particularly limited. The lower limit of the ratio is preferably 0.01 or more in terms of a mass ratio, more preferably 1 or more in terms of a mass ratio in view of an excellent dissolving ability for a metal-containing substance (particularly a Ru-containing substance), even more preferably 3 or more in terms of a mass ratio in view of an excellent dissolving ability for a metal-containing substance (particularly a Ru-containing substance) and an excellent dissolving ability for an oxidized metal-containing substance (particularly a $RuO_2$-containing substance), and particularly preferably 5 or more in terms of a mass ratio in view of an excellent dissolving ability for an oxidized metal-containing substance (particularly a $RuO_2$-containing substance).

<Water>

Water is not particularly limited, and is preferably water having undergone a purification treatment, such as distilled water, deionized water, or ultrapure water, and more preferably ultrapure water used for manufacturing semiconductors. Water to be incorporated into the composition may contain a trace of components that are unavoidably mixed in.

The content of water in the composition is not particularly limited, and is preferably 50% by mass or more, more preferably 65% by mass or more, and even more preferably 75% by mass or more. The upper limit thereof is not particularly limited, and is preferably 99.5% by mass or less, more preferably 99% by mass or less, and even more preferably 98% by mass or less.

<Optional Components>

The composition may contain other optional components in addition to the components described above. Hereinafter, the optional components will be described.

(pH Adjuster)

The composition may contain a pH adjuster. The pH adjuster does not include the aforementioned specific amine.

Examples of the pH adjuster include a basic compound and an acidic compound. The pH adjuster is appropriately selected depending on the target pH of the composition.

—Basic Compound—

The composition may contain, as a pH adjuster, a basic compound that exhibits alkalinity (pH of more than 7.0) in an aqueous solution. Examples of the basic compound include an inorganic base and an organic base (excluding the aforementioned specific amine).

Examples of the organic base include a quaternary ammonium compound. The quaternary ammonium compound is not particularly limited as long as it is a compound having a quaternary ammonium cation formed by the substitution of a nitrogen atom with 4 hydrocarbon groups (preferably alkyl groups) or a salt of the compound.

Examples of the quaternary ammonium compound include quaternary ammonium hydroxide, quaternary ammonium fluoride, quaternary ammonium bromide, quaternary ammonium iodide, quaternary ammonium acetate, and quaternary ammonium carbonate.

As the quaternary ammonium compound, a quaternary ammonium hydroxide is preferable, and is more preferably a compound represented by the following Formula (2).

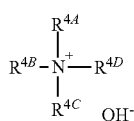

Formula (2)

In Formula (2), $R^{4A}$ to $R^{4D}$ each independently represent an alkyl group having 1 to 6 carbon atoms (preferably a methyl group, an ethyl group, a propyl group, or a butyl group), a hydroxyalkyl group having 1 to 6 carbon atoms (preferably a hydroxymethyl group, a hydroxyethyl group, or a hydroxybutyl group), a benzyl group, or an aryl group (preferably a phenyl group, a naphthyl group, or a naphthalene group). Among these, an alkyl group having 1 to 6 carbon atoms, a hydroxyethyl group having 1 to 6 carbon atoms, or a benzyl group is preferable.

As the compound represented by Formula (2), tetramethylammonium hydroxide (TMAH), ethyltrimethylammonium hydroxide (ETMAH), tetraethylammonium hydroxide (TEAH), tetrabutylammonium hydroxide (TBAH), dimethyldipropylammonium hydroxide, trimethylhydroxyethylammonium hydroxide, methyltri(hydroxyethyl)ammonium hydroxide, tetra(hydroxyethyl)ammonium hydroxide, trimethylbenzylammonium hydroxide, bishydroxyethyldimethylammonium hydroxide, or choline is preferable, and TMAH, ETMAH, TEAH, or TBAH is more preferable.

In view of an effect of removing a metal-containing substance, few metal residues after use, economic feasibility, and stability of the composition, TMAH, ETMAH, TEAH, dimethyldipropylammonium hydroxide, bishydroxyethyldimethylammonium hydroxide, or trimethyl(hydroxyethyl)ammonium hydroxide is preferable.

Furthermore, the quaternary ammonium hydroxide compound described in JP2015-518068A may be also used.

Examples of the organic base other than the quaternary ammonium compound include amine oxides, nitros, nitrosos, oximes, ketoximes, aldoximes, lactams, and isocyanides.

Examples of the inorganic base include alkali metal hydroxides such as sodium hydroxide and potassium hydroxide, alkaline earth metal hydroxides, and ammonia.

As the basic compound, a salt of the above compound may also be used as long as the salt turns into a base or a nonion in an aqueous solution.

Furthermore, among the aforementioned specific amines, a compound exhibiting alkalinity (pH of higher than 7.0) in an aqueous solution may also be used as a basic compound.

As the basic compound, in view of an effect of removing a metal-containing substance, few metal residues after use, economic feasibility, stability of the composition, and the like, quaternary ammonium hydroxide is preferable, TMAH, ETMAH, TEAH, or dimethyldipropylammonium hydroxide is more preferable, and ETMAH or TEAH is even more preferable.

—Acidic Compound—

The composition may contain, as a pH adjuster, an acidic compound that exhibits acidity (pH of less than 7.0) in an aqueous solution. Examples of the acidic compound include an inorganic acid and an organic acid (excluding the aforementioned specific amine).

Examples of the inorganic acid include sulfuric acid, hydrochloric acid, phosphoric acid, nitric acid, hydrofluoric acid, perchloric acid, and hypochlorous acid. As the inorganic acid, sulfuric acid, hydrochloric acid, phosphoric acid, or nitric acid is preferable, and sulfuric acid, hydrochloric acid, or phosphoric acid is more preferable.

Examples of organic acid include carboxylic acid and sulfonic acid.

Examples of the carboxylic acid include lower aliphatic monocarboxylic acids (having 1 to 4 carbon atoms) such as formic acid, acetic acid, propionic acid, and butyric acid.

Examples of the sulfonic acid include methanesulfonic acid (MSA), benzenesulfonic acid, and p-toluenesulfonic acid (tosylic acid).

As the acidic compound, a salt of the above compound may also be used as long as the compound salt turns into an acid or an acid ion (anion) in an aqueous solution.

Furthermore, among the aforementioned specific amines, a compound that has a coordinating group such as a carboxy group, a sulfo group, or a phosphonic acid group and exhibits acidity (pH of less than 7.0) in an aqueous solution and/or an anionic surfactant which will be described later may also be used as an acidic compound.

As the acidic compound, sulfuric acid, hydrochloric acid, phosphoric acid, nitric acid, or sulfonic acid or a salt thereof is preferable, and sulfuric acid, hydrochloric acid, phosphoric acid, methanesulfonic acid, or p-toluenesulfonic acid is more preferable.

One kind of pH adjuster may be used alone, or two or more kinds of pH adjusters may be used in combination.

Furthermore, a commercially available pH adjuster or a pH adjuster appropriately synthesized by a known method may also be used.

The content of the pH adjuster with respect to the total mass of the composition is preferably 0.1% by mass or more, and more preferably 0.5% by mass or more. The upper limit thereof is not particularly limited, but is preferably 20.0% by mass or less with respect to the total mass of the composition.

It is also preferable to adjust the content of the pH adjuster within the aforementioned suitable range so that the pH of the composition falls into the suitable range which will be described later.

(Surfactant)

The composition may contain a surfactant.

The surfactant is not particularly limited as long as it is a compound having a hydrophilic group and a hydrophobic group (lipophilic group) in one molecule. Examples of the surfactant include an anionic surfactant, a cationic surfactant, and a nonionic surfactant.

The hydrophobic group of the surfactant is not particularly limited, and examples thereof include an aliphatic hydrocarbon group, an aromatic hydrocarbon group, and a combination of these. In a case where the hydrophobic group includes an aromatic hydrocarbon group, the number of carbon atoms in the hydrophobic group is preferably 6 or more, and more preferably 10 or more. In a case where the hydrophobic group does not include an aromatic hydrocarbon group and is composed of only an aliphatic hydrocarbon group, the number of carbon atoms in the hydrophobic group is preferably 8 or more, and more preferably 10 or more. The upper limit of the number of carbon atoms in the hydrophobic group is not particularly limited, and is preferably 24 or less, and more preferably 20 or less.

Examples of the anionic surfactant include an anionic surfactant having at least one kind of hydrophilic group selected from the group consisting of a sulfonic acid group, a carboxy group, a sulfuric acid ester group, and a phosphonic acid group in the molecule.

Examples of the anionic surfactant having a sulfonic acid group in the molecule include alkylsulfonic acid, alkylbenzenesulfonic acid, alkylnaphthalenesulfonic acid, alkyldiphenylether sulfonic acid, fatty acid amide sulfonic acid, and salts thereof.

Examples of the anionic surfactant having a carboxylic acid group in the molecule include polyoxyethylene alkyl ether carboxylic acid, polyoxyethylene alkyl ether acetic acid, polyoxyethylene alkyl ether propionic acid, a fatty acid, and salts thereof.

The salts of these anionic surfactants are not particularly limited, and examples thereof include an ammonium salt, a sodium salt, a potassium salt, and a tetramethylammonium salt.

The cationic surfactant is not particularly limited as long as it is a compound having a cationic hydrophilic group and the aforementioned hydrophobic group. Examples of the cationic surfactant include a quaternary ammonium salt-based surfactant and an alkyl pyridium-based surfactant.

One kind of surfactant may be used alone, or two or more kinds of surfactants may be used.

In a case where the composition contains a surfactant, the content of the surfactant with respect to the total mass of the composition is preferably 0.01% by mass or more, and more preferably 0.03% by mass or more. The upper limit thereof is not particularly limited. However, in view of suppressing foaming of the composition, the upper limit thereof is preferably 10% by mass or less, and more preferably 5% by mass or less.

(Water-Soluble Organic Solvent)

The composition may contain a water-soluble organic solvent as a solvent. The water-soluble organic solvent does not include the aforementioned specific amine.

Examples of the water-soluble organic solvent include an ether-based solvent, an alcohol-based solvent, a ketone-based solvent, an amide-based solvent, a sulfur-containing solvent, and a lactone-based solvent. The water-soluble organic solvent is preferably an organic solvent that can be mixed with water at an arbitrary ratio.

The ether-based solvent is not particularly limited as long as it is a compound having an ether bond (—O—). Examples thereof include diethyl ether, diisopropyl ether, dibutyl ether, t-butyl methyl ether, cyclohexyl methyl ether, tetrahydrofuran, diethylene glycol, dipropylene glycol, triethylene glycol, polyethylene glycol, alkylene glycol monoalkyl ether (ethylene glycol monomethyl ether, ethylene glycol monobutyl ether, propylene glycol monomethyl ether, diethylene glycol monomethyl ether, dipropylene glycol monomethyl ether, tripropylene glycol monomethyl ether, and diethylene glycol monobutyl ether), and alkylene glycol dialkyl ether (diethylene glycol diethyl ether, diethylene glycol dipropyl ether, diethylene glycol dibutyl ether, triethylene glycol diethyl ether, tetraethylene glycol dimethyl ether, tetraethylene glycol diethyl ether, ethylene glycol dimethyl ether, diethylene glycol dimethyl ether, and triethylene glycol dimethyl ether).

The number of carbon atoms in the ether-based solvent is not particularly limited, and is preferably 3 to 16, more preferably 4 to 14, and even more preferably 6 to 12.

Examples of the alcohol-based solvent include methanol, ethanol, 1-propanol, 2-propanol, 1-butanol, 2-butanol, ethylene glycol, propylene glycol, glycerin, 1,6-hexanediol, cyclohexanediol, sorbitol, xylitol, 2-methyl-2,4-pentanediol, 1,3-butanediol, and 1,4-butanediol.

The number of carbon atoms in the alcohol-based solvent is not particularly limited, and is preferably 1 to 8 and more preferably 1 to 4.

Examples of the ketone-based solvent include acetone, methyl ethyl ketone, methyl isobutyl ketone, and cyclohexanone.

Examples of the amide-based solvent include formamide, monomethylformamide, dimethylformamide, acetamide, monomethylacetamide, dimethylacetamide, monoethylacetamide, diethylacetamide, and N-methylpyrrolidone.

Examples of the sulfur-containing solvent include dimethyl sulfone, dimethyl sulfoxide, and sulfolane.

Examples of the lactone-based solvent include γ-butyrolactone and δ-valerolactone.

One kind of water-soluble organic solvent may be used alone, or two or more kinds of water-soluble organic solvents may be used. In a case where two or more kinds of water-soluble organic solvents are used, the total content thereof is preferably within the above range.

In a case where the composition contains a water-soluble organic solvent, the content of the water-soluble organic solvent is not particularly limited, but is preferably 0.1% to 10% by mass.

(Abrasive Particles)

It is preferable that the composition substantially do not contain abrasive particles.

In the present specification, the abrasive particles mean particles that are contained in a polishing liquid used for performing a polishing treatment on a semiconductor substrate and have an average primary particle diameter of 5 nm or more.

For the composition, "substantially does not contain abrasive particles" means that in a case where the composition is measured using a commercially available measurement device for a light scattering-type particle measurement method in a liquid, the number of abrasive particles having an average primary particle diameter of 5 nm or more contained in 1 mL of the composition is 10 or less. The number of abrasive particles having an average primary particle diameter of 5 nm or more contained in 1 mL of the composition is preferably 8 or less, and more preferably 5 or less.

Examples of the abrasive particles include inorganic abrasive grains such as silica (including colloidal silica and fumed silica), alumina, zirconia, ceria, titania, germania, manganese oxide, and silicon carbide; and organic abrasive grains such as polystyrene, polyacryl, and polyvinyl chloride.

The content of the abrasive particles contained in the composition is measured using a commercially available measurement device for a light scattering-type particle measurement method in a liquid by using a laser as a light source.

The average primary particle diameter of particles such as abrasive particles is determined by measuring particle diameters (circular equivalent diameters) of 1,000 primary particles randomly selected from an image captured using a transmission electron microscope TEM2010 (acceleration voltage 200 kV) manufactured by JEOL Ltd., and calculating the arithmetic mean thereof. The circular equivalent diameter is the diameter of a virtual perfect circle assumed to have the same projected area as the projected area of a particle observed.

Examples of the method for removing the abrasive particles from the composition include a purification treatment such as filtering.

As long as the effects of the present invention and the function of each component are not impaired, the composition may contain other components in addition to the components described above.

<pH>

The pH of the composition is not particularly limited and may be, for example, in a range of 1.0 to 13.0. The pH of the composition is preferably 10.0 or less in view of further improving the dissolving ability for a metal-containing substance (particularly a Ru-containing substance), more preferably 8.0 or less in view of further improving the dissolving ability for an oxidized metal-containing substance (particularly a $RuO_2$-containing substance), even more preferably 7.0 or less in view of even further improving the dissolving ability for a metal-containing substance (particularly a Ru-containing substance), and particularly preferably 6.0 or less in view of even further improving the dissolving ability for an oxidized metal-containing substance (particularly a $RuO_2$-containing substance).

In view of further improving the dissolving ability for a metal-containing substance (particularly a Ru-containing substance) and the dissolving ability for an oxidized metal-containing substance (particularly a $RuO_2$-containing substance), the lower limit of the pH of the composition is preferably 3.3 or more, more preferably 3.4 or more, and even more preferably 3.5 or more.

The pH of the composition is preferably 3.5 to 6.0.

In the present specification, the pH of the composition is determined by measuring pH at 25° C. by using a pH meter (F-51 (trade name) manufactured by HORIBA, Ltd.).

<Kit>

The composition may be a kit in which each component (raw material) is divided into a plurality of parts.

Examples of the method for making the composition into a kit include an aspect in which a liquid composition containing a periodic acid compound and a specific amine is prepared as a first liquid and a liquid composition containing other components is prepared as a second liquid.

The method for preparing the kit is not particularly limited. For example, by preparing the first and second liquids described above and then storing the liquids in different containers, a kit for preparing a composition may be prepared.

The method for preparing the first liquid is not particularly limited. Examples thereof include a method of adding a periodic acid compound and the specific amine to pure water obtained by purification and then performing stirring or the like to prepare the first liquid as a homogeneous aqueous solution.

The method for preparing the second liquid is not particularly limited, and the second liquid may be prepared according to the method for preparing the first liquid.

<Container>

The composition and the first and second liquids that the kit comprises can be stored, transported, and used by being filled into any container. It is preferable to use a container that has a high degree of cleanliness and is unlikely to cause elution of impurities. Examples of the container to be filled with the composition include a "CLEAN BOTTLE" series manufactured by AICELLO CORPORATION, "PURE BOTTLE" manufactured by KODAMA PLASTICS Co., Ltd., and the like. However, the container is not limited to these.

<Manufacturing Method>

The manufacturing method of the composition is not particularly limited. For example, by mixing together the components described above, the composition can be manufactured. There is no particular limitation on the order and/or timing of mixing together the components described above. Examples of the manufacturing method of the composition include a method of sequentially adding a periodic acid compound, a specific amine, and optional components to a stirrer of a mixer filled with purified pure water and then thoroughly stirring the components so that the components are mixed together.

Examples of the manufacturing method of the composition include a method of adjusting the pH of the washing solution in advance by using a pH adjuster and then mixing together components and a method of mixing together components and then adjusting the pH to a preset value by using a pH adjuster.

Furthermore, the composition may be manufactured by a method of manufacturing a concentrated solution having a lower water content than the water content of the composition to be used, and diluting the solution with a diluent (preferably water) when the composition needs to be used so that the content of each component is adjusted to a predetermined content. The composition may also be manufactured by a method of diluting the concentrated solution with a diluent and then adjusting the pH thereof to a preset value by using a pH adjuster. For diluting the concentrated solution, a predetermined amount of diluent may be added to the concentrated solution or a predetermined amount of concentrated solution may be added to a diluent.

[Object to be Treated]

The use of the aforementioned composition is not particularly limited. The composition is used, for example, for a substrate (semiconductor substrate) as an object to be treated so as to remove a metal-containing substance and/or an oxidized metal-containing substance on the substrate. Hereinafter, the term "removal target" means at least one kind of substance which is on a substrate, is to be removed using the composition, and is selected from the group consisting of a metal-containing substance and an oxidized metal-containing substance.

In the present specification, "on the substrate" includes, for example, all the sites such as front and back, the lateral surfaces, and the inside of grooves of a substrate. Furthermore, the removal target on the substrate includes not only a removal target that is on a surface of a substrate but also a removal target that is on a substrate via another layer.

The metal-containing substance is a material that contains a simple metal (metal atom) as a main component.

Examples of the metals included in the metal-containing substance include a metal M selected from Ru (ruthenium), Ti (titanium), Ta (tantalum), Co (cobalt), Cr (chromium), Hf (hafnium), Os (osmium), and Pt (platinum), Ni (nickel), Mn (manganese), Cu (copper), Zr (zirconium), Mo (molybdenum), La (lanthanum), W (tungsten), and Ir (iridium).

As the metal-containing substance, a substance containing the metal M is preferable.

Examples of the metal-containing substance include a simple metal M and an alloy containing the metal M.

The metal-containing substance may be a mixture including two or more kinds of compounds among the above.

Furthermore, as long as the metal-containing substance contains a metal as a main component, the metal-containing substance may be an oxide of a metal (preferably the metal M), a composite oxide including a nitride or an oxynitride, a composite nitride, or a composite oxynitride.

The content of metal atoms in a metal-containing substance with respect to the total mass of the metal-containing substance is preferably 10% by mass or more, more preferably 30% by mass or more, and even more preferably 50% by mass or more. The upper limit thereof is 100% by mass because the metal-containing substance may be a simple metal.

As the metal-containing substance, a Ru-containing substance is more preferable.

Examples of the Ru-containing substance include simple Ru and an alloy of Ru. As long as the Ru-containing substance contains Ru as a main component, the Ru-containing substance may include an oxide, nitride, or oxynitride of Ru.

The content of Ru atoms in the Ru-containing substance with respect to the total mass of the Ru-containing substance is preferably 10% by mass or more, more preferably 30% by mass or more, and even more preferably 50% by mass or more. The upper limit thereof is not particularly limited, but may be 100% by mass because the Ru-containing substance may be simple Ru.

The oxidized metal-containing substance is a material that contains an oxide of a metal as a main component.

Examples of the metal atom constituting the oxide of a metal contained in the oxidized metal-containing substance include the metal M described above. It is preferable that the oxidized metal-containing substance contain an oxide of the metal M.

The oxidized metal-containing substance may be a mixture including two or more kinds of metal oxides.

Furthermore, as long as the oxidized metal-containing substance contains a metal oxide as a main component, the oxidized metal-containing substance may contain a simple metal and/or a nitride of a metal.

The content of the metal oxide in the oxidized metal-containing substance with respect to the total mass of the oxidized metal-containing substance is preferably 5% by mass or more, and more preferably 20% by mass or more. The upper limit thereof is not particularly limited, and may be 100% by mass or less.

As the oxidized metal-containing substance, a ruthenium oxide ($RuO_2$)-containing substance is more preferable.

As long as the $RuO_2$-containing substance contains $RuO_2$ as a main component, the $RuO_2$-containing substance may contain simple Ru and/or a nitride of Ru.

The content of $RuO_2$ in the $RuO_2$-containing substance with respect to the total mass of the $RuO_2$-containing substance is preferably 5% by mass or more, and more preferably 20% by mass or more. The upper limit thereof is not particularly limited, and may be 100% by mass or less.

Examples of the object to be treated include a substrate having a metal-containing substance and/or an oxidized metal-containing substance. That is, the aforementioned object to be treated includes at least a substrate and at least one kind of substance selected from the group consisting of a metal-containing substance and an oxidized metal-containing substance that is on the substrate.

The type of substrate is not particularly limited, and is preferably a semiconductor substrate.

Examples of the substrate include various substrates such as a semiconductor wafer, a glass substrate for a photomask, a glass substrate for liquid crystal display, a glass substrate for plasma display, a substrate for field emission display (FED), a substrate for an optical disk, a substrate for a magnetic disk, and a substrate for a magneto-optical disk.

Examples of materials constituting the semiconductor substrate include silicon, silicon germanium, a Group III-V compound such as GaAs, and any combination of these.

The type of removal target (the metal-containing substance and/or the oxidized metal-containing substance) on the substrate is as described above.

The form of the removal target on the substrate is not particularly limited. For example, the removal target may be disposed in the form of a film (film as a removal target), in the form of a wiring line (wiring line as a removal target), or in the form of particles.

As described above, Ru (ruthenium) is preferable as a metal, and $RuO_2$ (ruthenium oxide) is preferable as an oxidized metal. That is, an object to be treated is preferable which has a substrate and a removal target (a film as a removal target, a wiring line as a removal target, or a particulate removal target) disposed on the substrate and in which each removal target is at least one kind of substance selected from the group consisting of a Ru-containing substance and a $RuO_2$-containing substance.

Furthermore, Cu (copper) or Co (cobalt) is also preferable as a metal, an oxide of Cu or Co is also preferable as an oxidized metal, and an object to be treated is preferable which has a substrate and a film as a removal target, a wiring line as a removal target, or a particulate removal target disposed on the substrate and in which each removal target is at least one kind of substance selected from the group consisting of a Co- or Cu-containing substance and a substance containing an oxide of Co or Cu.

There may be one kind of removal target or two or more kinds of removal targets on the substrate. That is, either a metal-containing substance or an oxidized metal-containing substance may be on the substrate, or both the metal-containing substance and oxidized metal-containing substance may be on the substrate. More specifically, the substrate may have both the Ru-containing substance (such as a Ru-containing film, a Ru-containing wiring line, and/or a particulate Ru-containing substance) and $RuO_2$-containing substance (such as a $RuO_2$-containing film, a $RuO_2$-containing wiring line and/or a particulate $RuO_2$-containing substance) thereon.

In a case where there are two or more kinds of removal targets on the substrate, the removal targets may be in the same form or different forms. For example, there may be a Ru-containing wiring line and a $RuO_2$-containing film on a substrate.

Examples of the substrate on which a removal target is disposed in the form of particles include a substrate that has a particulate removal target attached to the substrate as a residue after the substrate having a removal target going through dry etching and a substrate that has a particulate removal target attached to the substrate as a residue after chemical mechanical polishing (CMP) is performed on the removal target, which will be described later.

In a case where the object to be treated includes a film consisting of a metal-containing substance (metal-containing film) on a substrate, the thickness of the metal-containing film is not particularly limited and may be appropriately selected depending on the use. The thickness of the metal-containing film is preferably 50 nm or less, more preferably 20 nm or less, and even more preferably 10 nm or less. The lower limit thereof is not particularly limited, but is preferably 1 nm or more.

In a case where the object to be treated includes a film consisting of an oxidized metal-containing substance (oxidized metal-containing film) on a substrate, the thickness of the oxidized metal-containing film is not particularly limited and may be appropriately selected depending on the use. The thickness of the oxidized metal-containing film is preferably 50 nm or less, and more preferably 20 nm or less. The lower limit thereof is not particularly limited, but is preferably 0.3 nm or more.

The metal-containing film and/or the oxidized metal-containing film may be disposed only on one of the main surfaces of the substrate, or may be disposed on both the main surfaces of the substrate. Furthermore, the metal-containing film and/or the oxidized metal-containing film may be disposed on the entire main surface of the substrate, or may be disposed on a portion of the main surface of the substrate.

<Manufacturing Method of Object to be Treated>

The manufacturing method of an object to be treated having a metal-containing substance and/or a oxidized metal-containing substance on a substrate is not particularly limited.

As the manufacturing method of the object to be treated having a metal-containing substance on a substrate, for example, known methods such as a sputtering method, a physical vapor deposition (PVD) method, an atomic layer deposition (ALD) method, a chemical vapor deposition (CVD) method, and a molecular beam epitaxy (MBE) method can be used to form a metal-containing film on a substrate. In a case where the metal-containing film is formed by a sputtering method, a PVD method, an ALD method, a CVD method, or the like, sometimes a metal-containing substance is also attached to the back surface of the substrate having the metal-containing film (the surface opposite to the side of the metal-containing film).

Furthermore, a metal-containing wiring line may be formed on the substrate by performing the aforementioned method through a predetermined mask.

In addition, after the metal-containing film or the metal-containing wiring line is formed on the substrate, the substrate may be subjected to a different process or treatment and then used as the object to be treated by the present treatment method.

For example, by performing dry etching on the substrate having a metal-containing film or metal-containing wiring line, a substrate having dry etching residues containing a metal may be manufactured. A dry etching residue is a by-product generated as a result of performing dry etching (for example, plasma etching). Examples of the dry etching residue include an organic residue derived from a photoresist, a Si-containing residue, and a metal-containing residue. Furthermore, by performing CMP on the substrate having a metal-containing film or metal-containing wiring line, a substrate having a metal-containing substance may be manufactured.

Examples of the manufacturing method of an object to be treated having an oxidized metal-containing substance on a substrate include a method of forming an oxidized metal-containing film on a substrate by a sputtering method and a method of performing an oxidation treatment of bringing an oxidant into contact with a substrate having a metal-containing substance (for example, a substrate having a metal-containing substance manufactured by the method described above) (hereinafter, such an oxidation treatment will be also simply described as "oxidation treatment").

The oxidized metal-containing substance formed by the oxidation treatment is a substance formed by oxidation of at least a part of a metal-containing substance on a substrate. That is, the oxidation treatment may oxidize only the surface layer of the metal-containing substance or oxidize the entire metal-containing substance.

The oxidized metal-containing layer formed by the oxidation treatment that oxidizes only the surface layer of the metal-containing substance may be a layer that is formed by the oxidation of only a part of the surface layer of the metal-containing substance or a layer that is formed by the oxidation of the entire surface layer of the metal-containing substance.

The thickness of the oxidized metal-containing layer formed by the oxidation treatment that oxidizes only the surface layer of the metal-containing substance is not particularly limited, and is, for example, the thickness of 1 to 10 atomic layers. The thickness of one atomic layer of a metal or metal oxide is 1 nm or less (for example, 0.3 nm to 0.4 nm).

The target of the oxidation treatment is not particularly limited as long as it is a substrate having a metal-containing substance. Examples of the target include a substrate having a metal-containing substance described above as an object to be treated. More specifically, in a case where the oxidation treatment is performed on a substrate having a metal-containing film, a substrate having a metal-containing wiring line, and a substrate having a particulate metal-containing substance, a substrate having an oxidized metal-containing film, a substrate having an oxidized metal-containing wiring line, and a substrate having a particulate oxidized metal-containing substance are obtained respectively.

The method of oxidation treatment for oxidizing a metal-containing substance is not particularly limited. Examples thereof include a liquid treatment of bringing an oxidizing liquid into contact with the aforementioned object to be treated, a gas treatment of bringing an oxidizing gas into contact with the aforementioned object to be treated (such as an ozone treatment of bringing an ozone gas into contact with the substrate which will be described later or a heating treatment in oxygen that is a treatment of heating the substrate, which will be described later, in an oxygen atmosphere), and a dry etching treatment as well as a plasma ashing treatment that use a plasma.

The oxidant to be brought into contact with a metal-containing substance in the oxidation treatment is not particularly limited. As the oxidant, a substance having a function of oxidizing the metal-containing substance can be selected depending on the type of oxidation treatment. Examples of the oxidant include an oxidizing liquid, an oxidizing gas, and an oxygen gas plasma.

The object to be treated having an oxidized metal-containing substance on a substrate may be obtained by placing a substrate having a metal-containing substance in an atmosphere such as the atmosphere where an oxygen gas is present and oxidizing a part of the metal-containing substance.

Only one kind of oxidation treatment or two or more kinds of oxidation treatments may be performed.

As the oxidation treatment, particularly, a liquid treatment of bringing a predetermined oxidizing liquid into contact with the aforementioned object to be treated is preferable.

The oxidizing liquid may be a chemical liquid that contains a compound having a function of oxidizing the aforementioned metal-containing substance.

The aforementioned compound is not particularly limited, and includes hydrogen peroxide ($H_2O_2$), $FeC_{13}$, $FeF_3$, $Fe(NO_3)_3$, $Sr(NO_3)_2$, $CoF_3$, $MnF_3$, Oxone ($2KHSO_5 \cdot KHSO_4 \cdot K_2SO_4$), periodic acid, iodic acid, vanadium (V) oxide, vanadium (IV, V) oxide, ammonium vanadate, an ammonium polyatomic salt {for example, ammonium peroxomonosulfate, ammonium chlorite ($NH_4ClO_2$), ammonium chlorate ($NH_4ClO_3$), ammonium iodate ($NH_4IO_3$), ammonium nitrate ($NH_4NO_3$), ammonium perborate ($NH_4BO_3$), ammonium perchlorate ($NH_4ClO_4$), ammonium periodate ($NH_4IO_4$), ammonium persulfate (($NH_4)_2S_2O_8$), ammonium hypochlorite ($NH_4ClO$), or ammonium tungstate (($NH_4)_{10}H_2(W_2O_7)$)}, a sodium polyatomic salt {for example, sodium persulfate ($Na_2S_2O_8$), sodium hypochlorite (NaClO), or sodium perborate}, a potassium polyatomic salt {for example, potassium iodate ($KIO_3$), potassium permanganate ($KMnO_4$), potassium nitrate ($KNO_3$), potassium persulfate ($K_2S_2O_8$), or potassium hypochlorite (KClO)}, a tetramethylammonium polyatomic salt {For example, tetramethylammonium chlorite (($N(CH_3)_4$)$ClO_2$), tetramethylammonium chlorate (($N(CH_3)_4$)$ClO_3$), tetramethylammonium iodate (($N(CH_3)_4$)$IO_3$), tetramethylammonium perborate (($N(CH_3)_4$)$BO_3$), tetramethylammonium perchlorate (($N(CH_3)_4$)$ClO_4$), tetramethylammonium periodate (($N(CH_3)_4$)$IO_4$), or tetramethylammonium persulfate (($N(CH_3)_4$)$S_2O_8$)}, a tetrabutylammonium polyatomic salt {for example, tetrabutylammonium peroxomonosulfate}, peroxomonosulfate, iron nitrate ($Fe(NO_3)_3$), urea hydrogen peroxide (($CO(NH_2)_2$)$H_2O_2$), peracetic acid ($CH_3(CO)OOH$), 1,4-benzoquinone, toluquinone, dimethyl-1,4-benzoquinone, chloranil, alloxan, N-methylmorpholine N-oxide, trimethylamine N-oxide, and a combination of these.

In a case where above compound is a salt, a hydrate and an anhydride of the salt can also be used.

The oxidizing liquid may contain additives such as an acid and an alkali in addition to the above compound.

The aforementioned oxidizing liquid is preferably a chemical liquid selected from the group consisting of water, hydrogen peroxide water, a mixed aqueous solution of ammonia and hydrogen peroxide (APM), a mixed aqueous solution of hydrofluoric acid and hydrogen peroxide water (FPM), a mixed aqueous solution of sulfuric acid and hydrogen peroxide water (SPM), a mixed aqueous solution of hydrochloric acid and hydrogen peroxide water (HPM), water containing dissolved oxygen, water containing dissolved ozone, perchloric acid, and nitric acid.

The hydrogen peroxide water has a composition in which, for example, the content of $H_2O_2$ is 0.5% to 31% by mass with respect to the total mass of the hydrogen peroxide water. The content of $H_2O_2$ is more preferably 3% to 15% by mass.

The composition of APM is, for example, preferably in a range of "aqueous ammonia:hydrogen peroxide water:water=1:1:1" to "aqueous ammonia:hydrogen peroxide water:water=1:3:45" (mass ratio).

The composition of FPM is, for example, preferably in a range of "hydrofluoric acid:hydrogen peroxide water:water=1:1:1" to "hydrofluoric acid:hydrogen peroxide water:water=1:1:200" (mass ratio).

The composition of SPM is, for example, preferably in a range of "sulfuric acid:hydrogen peroxide water:water=3:1:0" to "sulfuric acid:hydrogen peroxide water:water=1:1:10" (mass ratio).

The composition of HPM is, for example, preferably in a range of "hydrochloric acid:hydrogen peroxide water:water=1:1:1" to "hydrochloric acid:hydrogen peroxide water:water=1:1:30" (mass ratio).

The preferred compositional ratio described above means a compositional ratio determined in a case where the aqueous ammonia is 28% by mass aqueous ammonia, the hydrofluoric acid is 49% by mass hydrofluoric acid, the sulfuric acid is 98% by mass sulfuric acid, the hydrochloric acid is 37% by mass hydrochloric acid, and the hydrogen peroxide water is 30% by mass hydrogen peroxide water.

"A:B:C=x:y:z to A:B:C=X:Y:Z" used above to describe a suitable range means that it is preferable that at least one (preferably two and more preferably all) of "A:B=x:y to A:B=X:Y", "B:C=y:z to B:C=Y:Z", or "A:C=x:z to A:C=X:Z" be satisfied.

The water containing dissolved oxygen is an aqueous solution having a composition in which, for example, the content of $O_2$ is 20 to 500 ppm by mass with respect to the total mass of the water containing dissolved oxygen.

The water containing dissolved ozone is an aqueous solution having a composition in which, for example, the content of $O_3$ is 1 to 60 ppm by mass with respect to the total mass of the water containing dissolved ozone.

Perchloric acid is, for example, an aqueous solution in which the content of $HClO_4$ is 0.001% to 60% by mass with respect to the total mass of the solution.

Nitric acid is, for example, an aqueous solution in which the content of $HNO_3$ is 0.001% to 60% by mass with respect to the total mass of the solution.

In the liquid treatment, the method of bringing the object to be treated into contact with the oxidizing liquid is not particularly limited. Examples of the method include a method of immersing the object to be treated in the oxidizing liquid stored in a tank, a method of spraying the oxidizing liquid onto the object to be treated, a method of irrigating the object to be treated with the oxidizing liquid, and any combination of the above methods.

The contact time between the object to be treated and the oxidizing liquid is, for example, preferably 0.25 to 10 minutes, and more preferably 0.5 to 5 minutes.

The temperature of the oxidizing liquid is preferably 20° C. to 75° C., and more preferably 20° C. to 60° C.

Examples of the oxidizing gas to be brought into contact with the object to be treated in the gas treatment include dry air, an oxygen gas, an ozone gas, and a mixed gas of these. The oxidizing gas may contain a gas other than these gases.

The oxidizing gas to be brought into contact with the object to be treated in the gas treatment is preferably an oxygen gas or an ozone gas. In a case where an oxygen gas or an ozone gas is brought into contact with the object to be treated, it is also preferable that the contact be made in an oxygen atmosphere, an ozone atmosphere, or an atmosphere of a mixed gas of oxygen and ozone.

In the gas treatment, it is also preferable to adopt an aspect in which the object to be treated is heated (for example, heated at 40° C. to 200° C.) while being brought into contact with an oxidizing gas.

The gas treatment is particularly preferably an ozone treatment of bringing an ozone gas into contact with the object to be treated or a heating treatment in oxygen in which the object to be treated is heated in an oxygen atmosphere.

In the ozone treatment, an ozone gas may be brought into contact with the object to be treated in an ozone atmosphere, or an ozone gas may be brought into contact with the object to be treated in an atmosphere of a mixed gas of an ozone gas and another gas (for example, an oxygen gas). Furthermore, the ozone treatment may be a treatment of heating the object to be treated while bringing the object to be treated into contact with an ozone gas.

In the aforementioned oxidation treatment (particularly, the liquid treatment), the object to be treated may further have another metal-containing substance different from the metal-containing substance that is to be an oxidized metal-containing substance through oxidation by the oxidation treatment, and a part or all of the another metal-containing substance may be intentionally or inevitably removed by the oxidation treatment (particularly, the liquid treatment).

Furthermore, in the oxidation treatment (particularly, the liquid treatment) described above, a part of the metal-containing substance of the object to be treated may be intentionally or inevitably removed.

The substrate of the object to be treated may have various layers and/or structures as desired, in addition to the removal target. For example, the substrate may have a metal wire, a gate electrode, a source electrode, a drain electrode, an insulating layer, a ferromagnetic layer, and/or a non-magnetic layer.

The substrate may have the structure of an exposed integrated circuit, for example, an interconnection mechanism such as a metal wire and a dielectric material. Examples of metals and alloys used in the interconnect mechanism include aluminum, a copper-aluminum alloy, copper, titanium, tantalum, cobalt, silicon, titanium nitride, tantalum nitride, and tungsten. The substrate may have a layer of silicon oxide, silicon nitride, silicon carbide, and/or carbon-doped silicon oxide.

The size, thickness, shape, layer structure, and the like of the substrate are not particularly limited, and can be appropriately selected as desired.

[Method for Treating Substrate]

The method for treating a substrate according to an embodiment of the present invention (hereinafter, also called "the present treatment method") has a step A of removing a metal-containing substance and/or an oxidized metal-containing substance (removal target) on a substrate by using the aforementioned composition (hereinafter, also called "the present composition").

As described above, the present treatment method is suitably used particularly in a case where the removal target includes at least one kind of substance selected from the group consisting of a Ru-containing substance and a $RuO_2$-containing substance.

Furthermore, the present treatment method is suitably used for a substrate having an oxidized metal-containing substance that is obtained by an oxidation treatment performed on a substrate having a metal-containing substance.

The composition used in the present treatment method is as described above.

In addition, the substrate having a removal target, which is an object to be treated by the present treatment method, is as described above.

Examples of specific methods of the step A include a method of bringing the substrate having metal-containing substances, which is an object to be treated, into contact with the composition.

The method of bringing the substrate into contact with the composition is not particularly limited, and examples thereof include a method of immersing the object to be treated in the composition stored in a tank, a method of spraying the composition onto the substrate, a method of irrigating the substrate with the composition, and any combination of these methods. Among these, the method of immersing the substrate having a removal target, which is an object to be treated, in the composition is preferable.

In order to further enhance the washing ability of the composition, a mechanical stirring method may also be used.

Examples of the mechanical stirring method include a method of circulating the composition on a substrate, a method of irrigating the substrate with the composition or spraying the composition onto the substrate, a method of stirring the composition by using ultrasonic or megasonic waves, and the like.

The treatment time of the step A can be adjusted according to the method of bringing the composition into contact with the substrate, the temperature of the composition, and the like. The treatment time (the contact time between the composition and the object to be treated) is not particularly limited, and is preferably 0.25 to 10 minutes, and more preferably 0.5 to 2 minutes.

The temperature of the composition during the treatment is not particularly limited, and is preferably 20° C. to 75° C. and more preferably 20° C. to 60° C.

In the step A, only one kind of removal target or two or more kinds of removal targets on the substrate may be removed.

In a case where two or more kinds of removal targets are removed by the step A, the two or more kinds of removal targets may be removed simultaneously by a single treatment or may be separately treated. The present composition is preferably used in a removal treatment performed to remove at least one kind of removal target in the step A of removing two or more kinds of removal targets on the substrate by a plurality of removal treatments.

Examples of the combination of two or more kinds of removal targets include a combination of metal-containing substances or oxidized metal-containing substances using two or more kinds of metals among the metal M described above and a combination of a metal-containing substance and an oxidized metal-containing substance having the same type of metal atoms. Among these, in view of making it possible to remove two or more kinds of removal targets by a single removal treatment using the aforementioned composition, a combination of a metal-containing substance and an oxidized metal-containing substance having the same type of metal atoms is preferable, and a combination of a Ru-containing substance and a $RuO_2$-containing substance is more preferable.

In the step A, a treatment may be performed in which while the contents of a periodic acid compound, the specific amine, and/or an optional component in the composition are being measured, a solvent (preferably water) is added to the composition as necessary. In a case where this treatment is performed, the contents of components in the composition can be stably maintained in a predetermined range.

Examples of the method for measuring the contents of a periodic acid compound, the specific amine, and optional components in the composition include ion chromatography. Specifically, examples of the device include Dionex ICS-2100 manufactured by Thermo Fisher Scientific Inc.

Specifically, examples of suitable aspects of the step A include a step A1 of performing a recess etching treatment by using the composition on a wiring line that is disposed on a substrate and consists of a metal-containing substance or an oxidized metal-containing substance, a step A2 of removing a film in an outer edge portion of a substrate by using the composition, the substrate having the film consisting of a metal-containing substance or an oxidized metal-containing substance disposed thereon, a step A3 of removing a metal-containing substance or an oxidized metal-containing substance attached to a back surface of a substrate by using the composition, the substrate having a film consisting of a metal-containing substance or an oxidized metal-containing substance disposed thereon, a step A4 of removing a metal-containing substance or an oxidized metal-containing substance on a substrate having undergone dry etching by using the composition, and a step A5 of removing a metal-containing substance or an oxidized metal-containing substance on a substrate having undergone chemical mechanical polishing by using the composition.

As the step A, among these, the step A1 or A4 is preferable, and the step A1 is more preferable.

Hereinafter, the present treatment method used in each of the above treatments will be described.

<Step A1>

Examples of the step A include a step A1 of performing a recess etching treatment by using the composition on a metal-containing wiring line disposed on a substrate.

FIG. 1 is a schematic cross-sectional top view showing an example of a substrate (hereinafter, also described as "wiring board") that is an object to be treated by the recess etching treatment in the step A1 and has a wiring line (hereinafter, also described as "wiring line as a removal target") consisting of a metal-containing substance or an oxidized metal-containing substance.

A wiring board 10a shown in FIG. 1 has a substrate not shown in the drawing, an insulating film 12 having a groove disposed on the substrate, a barrier metal layer 14 disposed along the inner wall of the groove, and a wiring line 16 as a removal target that fills up the inside of the groove.

The substrate and the wiring line as a removal target in the wiring board are as described above.

As the wiring line as a removal target, a Ru-containing wiring line (wiring line containing Ru as a main component), a $RuO_2$-containing wiring line (wiring line containing $RuO_2$ as a main component), or a complex having both the Ru-containing wiring line and $RuO_2$-containing wiring line is preferable. Examples of the aforementioned complex include a laminate of a Ru-containing wiring line and a $RuO_2$-containing layer that is formed on the surface layer of the Ru-containing wiring line.

The material constituting the barrier metal layer in the wiring board is not particularly limited, and examples thereof include titanium nitride (TiN) and tantalum nitride (TaN).

In FIG. 1, an aspect is illustrated in which the wiring board has a barrier metal layer. However, the wiring board may not have the barrier metal layer.

Although FIG. 1 does not show a liner layer, a liner layer may be disposed between the barrier metal layer 14 and the metal-containing wiring line 16. The material constituting the liner layer is not particularly limited, and examples thereof include a Ru-containing substance, a Cu-containing substance, and a Co-containing substance.

The manufacturing method of the wiring board is not particularly limited, and examples thereof include a method including a step of forming an insulating film on a substrate, a step of forming a groove in the insulating film, a step of forming a barrier metal layer on the insulating film, a step of forming a metal-containing film or an oxidized metal-containing film that fills up the groove, and a step of performing a planarizing treatment on the metal-containing film or the oxidized metal-containing film.

In the step A1, a recess etching treatment is performed on the wiring line as a removal target in the wiring board by using the aforementioned composition, so that a portion of the wiring line as a removal target can be removed, and a recess portion can be formed.

Figure 2:
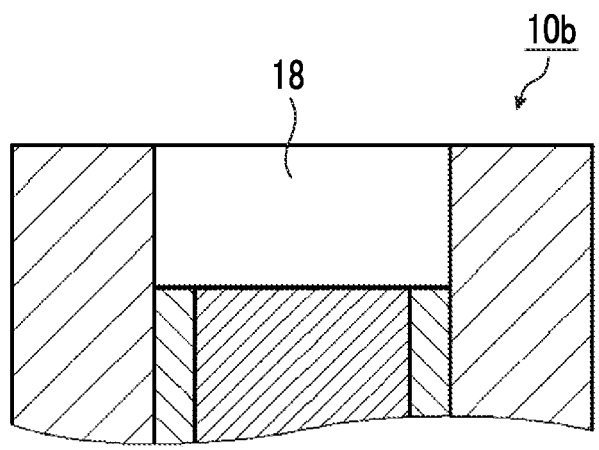
FIG. 2 is a schematic cross-sectional top view showing an example of an object to be treated having undergone the step A1.

More specifically, in a case where the step A1 is performed, as shown in a wiring board 10b in FIG. 2, a portion of the barrier metal layer 14 and the wiring line 16 as a removal target is removed, and a recess portion 18 is formed.

Examples of specific methods of the step A1 include a method of bringing the wiring board into contact with the composition.

The method of bringing the wiring board into contact with the composition is as described above.

The suitable ranges of the contact time between the composition and the wiring board and the temperature of the composition are as described above.

(Steps A1a and A1b)

As the step A1, a step A1a of removing at least one kind of removal target among two or more kinds of removal targets disposed on a substrate and a step A1b of removing a removal target different from the removal target removed by the step A1a may be performed.

The steps A1a and A1b are performed, for example, on a wiring board in which a liner layer is disposed between a wiring line as a removal target and a barrier metal layer, and the wiring line as a removal target and the liner layer are different removal targets.

In a case where the wiring line as a removal target and the liner layer are composed of different removal targets, sometimes the component constituting the wiring line as a removal target and the component constituting the liner layer exhibit different solubility in a treatment solution depending on the type of components. In such a case, it is preferable to perform the step A1a of removing the wiring line as a removal target by using a solution A that dissolves better the wiring line as a removal target than the liner layer and to perform the step A1b of removing the liner layer by using a solution B that dissolves better the liner layer than the wiring line as a removal target, because performing the two-step removal treatment consisting of the steps A1a and A1b makes it possible to finely adjust to what extent the wiring line as a removal target and the liner layer will be removed and to ensure the in-plane uniformity of a wafer.

The wiring board comprising the wiring line as a removal target and the liner layer is preferably a combination of a Cu-containing wiring line or a Co-containing wiring line that is a wiring line as a removal target and a Ru-containing substance that is a liner layer or a combination of a Ru-containing wiring line that is a wiring line as a removal target and a Cu-containing substance or a Co-containing substance that is a liner layer, and more preferably a combination of a Cu-containing wiring line or a Co-containing wiring line that is a wiring line as a removal target and a Ru-containing substance that is a liner layer.

In a case where the wiring line as a removal target is a Ru-containing wiring line, and the liner layer is a Cu-containing substance or a Co-containing substance, it is preferable to use the present composition as the solution A used in the step A1a of removing a wiring line as a removal target. In a case where the wiring line as a removal target is a Cu-containing wiring line or a Co-containing wiring line, and the liner layer is a Ru-containing substance, it is preferable to use the present composition as the solution B used in the step A1b of removing a liner layer.

In a case where the steps A1a and A1b are performed as the step A1, one of the solutions A and B is the present composition, and the other is a solution other than the present composition. The solution other than the present composition that can be used as the solution A or B in the step A1a or A1b is not particularly limited. Depending on the type of two or more kinds of removal targets disposed on a substrate, the etching selectivity of the present composition, and the like, known solutions can be used.

For instance, in a case where the step A1b of removing a liner layer by using the present composition is to be performed on a wiring board having a Cu-containing wiring line or a Co-containing wiring line as a wiring line as a removal target and a Ru-containing substance as a liner layer, examples of the solution other than the present composition that can be used in the step A1a of removing a wiring line as a removal target include a mixed solution of sulfuric acid and hydrogen peroxide water (SPM), a mixed solution of aqueous ammonia and hydrogen peroxide water (SC-1 or APM), hydrogen peroxide and aqueous acidic solution repeatedly used for the treatment, and the like.

In the present treatment method, the step A1a and the step A1b may be alternately performed.

In a case where the steps A1a and A1b are alternately performed, it is preferable that each of the step A1a and the step A1b be performed 1 to 10 times.

<Step B>

Before or after the step A1, if necessary, a step B of treating the wiring board by using a predetermined solution (hereinafter, also called "specific solution") may be performed.

Particularly, as described above, in a case where a barrier metal layer is disposed on the substrate, sometimes the component constituting the wiring line as a removal target and the component constituting the barrier metal layer exhibit different solubility in the present composition depending on the type of the components. In this case, it is preferable to adjust to what extent the wiring line as a removal target and the barrier metal layer will dissolve by using a solution that dissolves better the barrier metal layer.

In this respect, as the specific solution, a solution is preferable which poorly dissolves the wiring line as a removal target but excellently dissolves the substance constituting the barrier metal layer.

Examples of the specific solution include a mixed solution of hydrofluoric acid and hydrogen peroxide water (FPM), a mixed solution of sulfuric acid and hydrogen peroxide water (SPM), a mixed solution of aqueous ammonia and hydrogen peroxide water (APM), and a mixed solution of hydrochloric acid and hydrogen peroxide water (HPM).

The composition of each of FPM, SPM, APM, and HPM is the same as the composition of each solution in the aforementioned oxidizing liquid, including a suitable range.

In the step B, as the method of treating the substrate by using the specific solution, a method of bringing the substrate into contact with the specific solution is preferable. The method of bringing the substrate into contact with the specific solution is not particularly limited, and examples thereof include the same method as the method of bringing the substrate into contact with the composition.

The contact time between the specific solution and the substrate is, for example, preferably 0.25 to 10 minutes, and more preferably 0.5 to 5 minutes.

In the present treatment method, the step A1 and the step B may be alternately performed.

In a case where the steps are alternately performed, it is preferable that each of the step A1 and the step B is performed 1 to 10 times.

In a case where the step A1 includes the steps A1a and A1b, the step B may be performed before the steps A1a and A1b or after the steps A1a and A1b. Furthermore, the step A1 that consists of the steps A1a and A1b and the step B may be alternately performed.

<Step A2>

Examples of the step A include a step A2 of removing a film as a removal target that is in an outer edge portion of a substrate by using the composition, the substrate having the film (hereinafter, also described as "film as a removal target") consisting of a metal-containing substance or an oxidized metal-containing substance disposed thereon.

Figure 3:
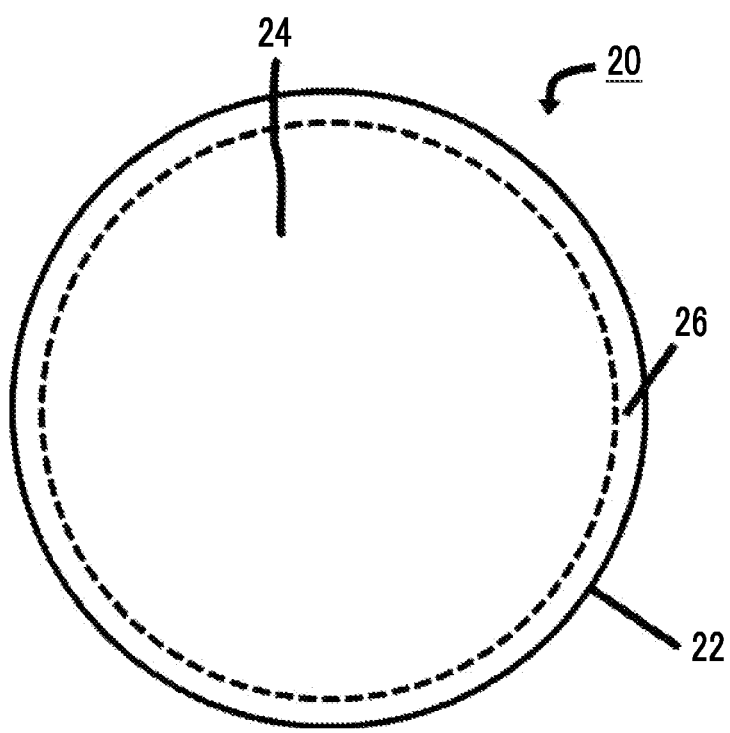
FIG. 3 is a schematic view showing an example of an object to be treated used in a step A2.

FIG. 3 is a schematic view (top view) showing an example of a substrate on which a film as a removal target that is an object to be treated by the step A2 is disposed.

An object 20 to be treated by the step A2 shown in FIG. 3 is a laminate having a substrate 22 and a film 24 as a removal target disposed on one main surface (entire region surrounded by the solid line) of the substrate 22. As will be described later, in step A2, the film 24 as a removal target positioned at an outer edge portion 26 (the region outside the broken line) of the object 20 to be treated is removed.

The substrate in the object to be treated and the metal-containing film and oxidized metal-containing film that are a film as a removal target in the object to be treated are as described above.

As the film as a removal target, a Ru-containing film (a film containing Ru as a main component), a $RuO_2$-containing film (a film containing $RuO_2$ as a main component), or a complex consisting of a Ru-containing film and a $RuO_2$-containing film is preferable. Examples of the aforementioned complex include a laminate of a Ru-containing film and a $RuO_2$-containing film formed on the surface layer of the Ru-containing film.

The specific method of the step A2 is not particularly limited, and examples thereof include a method of supplying the composition from a nozzle such that the composition comes into contact with only the film as a removal target at the outer edge portion of the substrate.

During the treatment of the step A2, it is possible to preferably use the substrate treatment device and the substrate treatment method described in JP2010-267690A, JP2008-080288A, JP2006-100368A, and JP2002-299305A.

The method of bringing the object to be treated into contact with the composition is as described above.

The suitable ranges of the contact time between the composition and the object to be treated and the temperature of the composition are as described above.

<Step A3>

Examples of the step A include a step A3 of removing a removal target attached to a back surface of a substrate by using the composition, the substrate having a film as a removal target disposed thereon.

Examples of the object to be treated by the step A3 include the object to be treated used in the step A2. At the time of forming the object to be treated, which includes a substrate and a film as a removal target disposed on one main surface of the substrate, used in the step A2, the film as a removal target is formed by sputtering, CVD, or the like. At this time, sometimes a removal target attached to a surface (back surface) of the substrate that is opposite to the film as a removal target. The step A3 is performed to remove such a removal target in the object to be treated.

The specific method of the step A3 is not particularly limited, and examples thereof include a method of spraying the composition such that the composition comes into contact with only the back surface of the substrate.

The method of bringing the object to be treated into contact with the composition is as described above.

The suitable ranges of the contact time between the composition and the object to be treated and the temperature of the composition are as described above.

<Step A4>

Examples of the step A include a step A4 of removing a removal target on a substrate by using the composition, the substrate having undergone dry etching.

Figure 4:
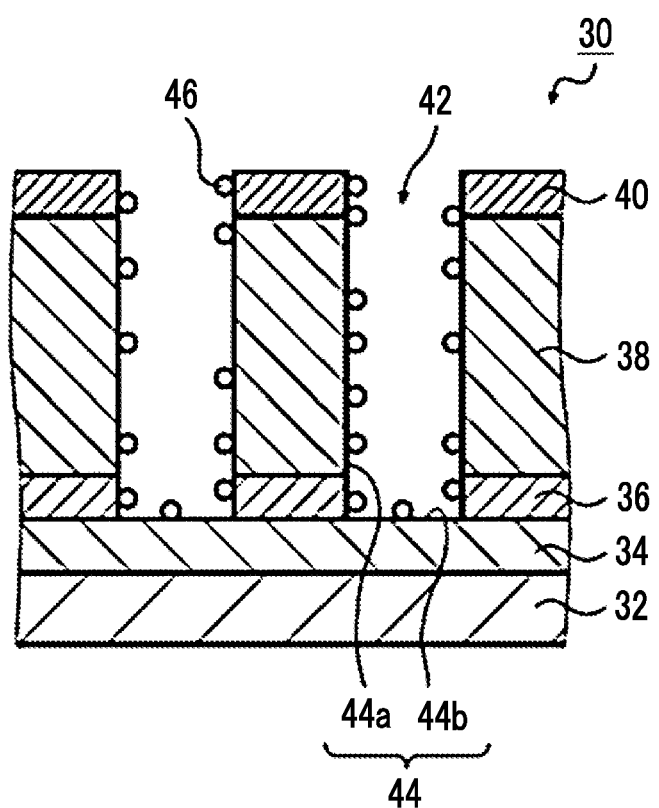
FIG. 4 is a schematic cross-sectional view showing an example of an object to be treated used in a step A4.

FIG. 4 is a schematic view showing an example of the object to be treated by the step A4.

An object 30 to be treated shown in FIG. 4 comprises a film 34 as a removal target, an etching stop layer 36, an interlayer insulating film 38, a metal hard mask 40 in this order on a substrate 32. Through a dry etching process or the like, a hole 42 exposing the film 34 as a removal target is formed at a predetermined position. That is, the object to be treated shown in FIG. 4 is a laminate which comprises the substrate 32, the film 34 as a removal target, the etching stop layer 36, the interlayer insulating film 38, and the metal hard mask 40 in this order and comprises the hole 42 that extends from the surface of the metal hard mask 40 to the surface of the film 34 as a removal target at the position of the opening portion of the metal hard mask 40. An inner wall 44 of the hole 42 includes a cross-sectional wall 44a which consists of the etching stop layer 36, the interlayer insulating film 38, and the metal hard mask 40, and a bottom wall 44b which consists of the exposed film 34 as a removal target. A dry etching residue 46 is attached to the inner wall 44.

The dry etching residue includes a removal target.

As the film as a removal target in the step A4, a Ru-containing film (a film containing Ru as a main component), a $RuO_2$-containing film (a film containing $RuO_2$ as a main component), or a complex consisting of a Ru-containing film and a $RuO_2$-containing film is preferable. Examples of the aforementioned complex include a laminate of a Ru-containing film and a $RuO_2$-containing film formed on the surface layer of the Ru-containing film.

As the removal target in the step A4, a Ru-containing substance is preferable.

As the interlayer insulating film and the metal hard mask, known materials are selected.

Although FIG. 4 describes an aspect in which a metal hard mask is used, a resist mask formed of a known photoresist material may also be used.

Examples of the specific method of the step A4 include a method of bringing the aforementioned object to be treated into contact with the composition.

The method of bringing the wiring board into contact with the composition is as described above.

The suitable ranges of the contact time between the composition and the wiring board and the temperature of the composition are as described above.

<Step A5>

Examples of the step A include a step A5 of removing a removal target on a substrate by using the composition, the substrate having undergone chemical mechanical polishing (CMP).

The CMP technique is used for planarizing an insulating film, planarizing connection holes, and a manufacturing process of a damascene wiring line and the like. In some cases, a substrate having undergone CMP is contaminated with a large amount of contaminants such as particles used as abrasive particles and metal impurities. Therefore, it is necessary to remove these contaminants and wash the substrate before the next processing stage starts. Performing the step A5 makes it possible to remove a removal target which is generated in a case where the object to be treated by CMP has a wiring line as a removal target or a film as a removal target and attached onto the substrate.

As described above, examples of the object to be treated by the step A5 include a substrate having undergone CMP that has a removal target.

As the removal target, a Ru-containing substance, a $RuO_2$-containing substance, or a complex consisting of a Ru-containing substance and a $RuO_2$-containing substance is preferable. Examples of the aforementioned complex include a laminate of a Ru-containing substance and a $RuO_2$-containing layer that is formed on the surface layer of the Ru-containing substance.

Examples of the specific method of the step A5 include a method of bringing the aforementioned object to be treated into contact with the composition.

The method of bringing the wiring board into contact with the composition is as described above.

The suitable ranges of the contact time between the composition and the wiring board and the temperature of the composition are as described above.

<Step C>

As necessary, the present treatment method may have a step C of performing a rinsing treatment on a substrate by using a rinsing liquid after the step A, the substrate being obtained by the step A.

In a case where the substrate is brought into contact with the present composition, sometimes an iodine compound derived from the present composition is attached to the surface of the substrate as residual iodine. Performing the rinsing step makes it possible to remove the residual iodine from the surface of the substrate.

As the rinsing liquid, for example, hydrofluoric acid, hydrochloric acid, hydrogen peroxide water, a mixed solution of hydrofluoric acid and hydrogen peroxide water, a mixed solution of sulfuric acid and hydrogen peroxide water, a mixed solution of aqueous ammonia and hydrogen peroxide water, a mixed solution of hydrochloric acid and hydrogen peroxide water, aqueous carbon dioxide, ozonated water, aqueous hydrogen, an aqueous citric acid solution, sulfuric acid, aqueous ammonia, isopropyl alcohol, an aqueous hypochlorous acid solution, aqua regia, ultrapure water, nitric acid, perchloric acid, an aqueous oxalic acid solution, or an aqueous orthoperiodic acid solution is preferable. As long as the purpose of the rinsing step is not impaired, these rinsing liquids may be used by being mixed together.

The hydrofluoric acid, nitric acid, perchloric acid, and hydrochloric acid mean aqueous solutions obtained by dissolving HF, $HNO_3$, $HClO_4$, and HCl in water respectively.

The sulfuric acid may be an aqueous solution obtained by dissolving $H_2SO_4$ in water.

The ozonated water, aqueous carbon dioxide, and aqueous hydrogen mean aqueous solutions obtained by dissolving $O_3$, $CO_2$, and $H_2$ in water respectively.

Among the above, as the rinsing liquid, in view of further reducing iodine remaining on the surface of the substrate after the rinsing step, aqueous carbon dioxide, ozonated water, aqueous hydrogen, hydrofluoric acid, an aqueous citric acid solution, hydrochloric acid, sulfuric acid, aqueous ammonia, hydrogen peroxide water, SPM, APM, HPM, IPA, an aqueous hypochlorous acid solution, aqua regia, or FPM is preferable, and hydrofluoric acid, hydrochloric acid, hydrogen peroxide water, SPM, APM, HPM, or FPM is more preferable.

Examples of the specific method of the step C include a method of bringing the substrate as an object to be treated obtained by the step A into contact with the rinsing liquid.

The method of bringing the substrate into contact with the rinsing liquid is performed by immersing the substrate in the rinsing liquid put in a tank, spraying the rinsing liquid onto the substrate, irrigating the substrate with the rinsing liquid, or any combination of these.

The treatment time (contact time between the rinsing liquid and the object to be treated) is not particularly limited, and may be 5 seconds or more and 5 minutes or less.

The temperature of the rinsing liquid during the treatment is not particularly limited, and is preferably 16° C. to 60° C., and more preferably 18° C. to 40° C.

<Step D>

As necessary, the present treatment method may have a step D of performing a drying treatment after the step C. The method of the drying treatment is not particularly limited, and examples thereof include spin drying, placing the substrate under a drying gas stream, heating the substrate by a heating unit such as a hot plate or an infrared lamp, isopropyl alcohol (IPA) vapor drying, Marangoni drying, Rotagoni drying, and any combination of these.

The drying time varies with the specific method to be used, but is about 30 seconds or more and a few minutes or less in general.

The present treatment method may be performed in combination before or after other steps performed on a substrate. While being performed, the present treatment method may be incorporated into those other steps. Alternatively, while those other steps are being performed, the treatment method according to the embodiment of the present invention may be incorporated into the steps and performed.

Examples of those other steps include a step of forming each structure such as metal wire, a gate structure, a source structure, a drain structure, an insulating layer, a ferromagnetic layer and/or a nonmagnetic layer (layer formation, etching, chemical mechanical polishing, modification, and the like), a step of forming resist, an exposure step and a removing step, a heat treatment step, a washing step, an inspection step, and the like.

The present treatment method may be performed at any stage in the back end process (BEOL: Back end of the line), the middle process (MOL: Middle of the line) or in the front end process (FEOL: Front end of the line). However, from the viewpoint of enabling the effects of the present invention to be further demonstrated, it is preferable to perform the present treatment method in the front end process or the middle process.

EXAMPLES

Hereinafter, the present invention will be more specifically described based on examples. The materials, the amounts and ratios of the materials used, the details of treatments, and the procedures of treatments shown in the following examples can be appropriately changed as long as the gist of the present invention is maintained. Therefore, the scope of the present invention is not restricted by the following examples.

[Preparation of Composition]

The compositions having the makeups shown in the following Table 1 were prepared, and the prepared compositions were tested as below.

The periodic acid compound (oxidant), specific amine (additive), pH adjuster, and water used for preparing the compositions will be described below.

All of the following components used for preparing the compositions are products obtained from the market, and include the products classified as a semiconductor grade or products classified as a high-purity grade.

(Periodic Acid Compound)
  Orthoperiodic acid
  Metaperiodic acid
(Oxidant that does not Correspond to Periodic Acid Compound)
  Sodium hypochlorite
(Specific Amine)
  1,3-Propanediamine
  1,4-Butanediamine
  β-Alanine
  4-Aminobutyric acid
  5-Aminovaleric acid
  1,6-Hexanediamine
  Succinic acid amide
  Malonamide
  Propanamide
  Butyramide
  Adipamide
  2-Aminoethylphosphonic acid
  Taurine
  Glycine
  7-Aminoheptanoic acid
  1,8-Octanediamine
  Aminomethanesulfonic acid
  Aminomethanephosphonic acid
  Methyl carbamate
  Bishexamethylenetriamine
  Diethylenetriamine
  N-Methyl-1,3-propanediamine
  2,2-Dimethyl-1,3-propanediamine
  N-Ethylethylenediamine
  N-(2-aminoethyl)piperazine
(Additives that do not Correspond to Specific Amine)
  Diglycolamine
  Monoethanolamine
  Succinic acid
  Aniline
  2,4,6-Trimethylaniline
(pH Adjuster)
  Sulfuric acid
  MSA (methanesulfonic acid)
  ETMAH (ethyltrimethylammonium hydroxide)
  TEAH (tetraethylammonium hydroxide)
  Hydrochloric acid
  Phosphoric acid
  p-Toluenesulfonic acid
  Nitric acid
(Water)
  Ultrapure water In Table 1, the column of "Amount" shows the content (unit: % by mass) of each component with respect to the total mass of the composition.

In Table 1, the column of "Number of carbon atoms" shows the number of carbon atoms of a component used as the specific amine or an additive.

In Table 1, the numerical value in the column of "Ratio 1" shows the ratio (mass ratio) of the content of periodic acid (or oxidant) to the content of the specific amine (or additive).

In each example and each comparative example, the content of "pH adjuster" listed in Table 1 was adjusted so that the composition had a pH listed in the column of "Composition pH" in Table 1.

In Table 1, "Remainder" in the column of "Water" means that the remainder other than the periodic acid compound (oxidant), the specific amine (additive), and the pH adjuster contained in the composition is water.

[Test]

<Ru Dissolving Ability>

Substrates were prepared in which a Ru layer (layer composed of simple Ru) was formed on one surface of a commercial silicon wafer (diameter: 12 inches) by a PVD method.

Each of the obtained substrates was put in a container filled with the composition of each of the examples or comparative examples, and the composition was stirred to perform a Ru layer removal treatment. The temperature of the composition was 25° C.

<$RuO_2$ Dissolving Ability>

Substrates were prepared in which a $RuO_2$ layer (layer composed of only $RuO_2$) was formed on one surface of a commercial silicon wafer (diameter: 12 inches) by a sputtering method.

Each of the obtained substrates was put in a container filled with the composition of each of the examples or comparative examples, and the composition was stirred to perform a $RuO_2$ layer removal treatment. The temperature of the composition was 25° C.

[Evaluation]

<Ru/$RuO_2$ Dissolving Ability>

The etching rate (Å/min) of the Ru layer or the $RuO_2$ layer was calculated from the difference in the thickness of the Ru layer or $RuO_2$ layer before and after the treatment. The calculated etching rate of the Ru layer or $RuO_2$ layer was evaluated according to the following standard. Table 1 shows the evaluation results.

A: The etching rate is 175 Å/min or more.
B: The etching rate is 100 Å/min or more and less than 175 Å/min.
C: The etching rate is 50 Å/min or more and less than 100 Å/min.
D: The etching rate is less than 50 Å/min The results are shown in the following tables.

TABLE 1

| | Makeup of composition | | | | | | | | |
|---|---|---|---|---|---|---|---|---|---|
| | Periodic acid compound | | Specific amine | | | | | | |
| | Type | Amount [%] | Type | Number of carbon atoms | Amount [%] | | | | |
| Example 1 | Orthoperiodic acid | 2.50 | 1,3-Propanediamine | 3 | 0.10 | | | | |
| Example 2 | Orthoperiodic acid | 2.50 | 1,4-Butanediamine | 4 | 0.20 | | | | |
| Example 3 | Metaperiodic acid | 2.50 | β-Alanine | 3 | 0.25 | | | | |
| Example 4 | Orthoperiodic acid | 2.50 | 4-Aminobutyric acid | 4 | 0.40 | | | | |
| Example 5 | Metaperiodic acid | 2.50 | 5-Aminovaleric acid | 5 | 0.50 | | | | |
| Example 6 | Orthoperiodic acid | 2.50 | 1,6-Hexanediamine | 6 | 0.09 | | | | |
| Example 7 | Orthoperiodic acid | 2.50 | Succinic acid amide | 4 | 0.50 | | | | |
| Example 8 | Orthoperiodic acid | 2.50 | Malonamide | 3 | 0.35 | | | | |
| Example 9 | Metaperiodic acid | 2.50 | Propanamide | 3 | 0.45 | | | | |
| Example 10 | Orthoperiodic acid | 2.50 | Butyramide | 4 | 0.15 | | | | |
| Example 11 | Metaperiodic acid | 2.50 | Adipamide | 6 | 0.20 | | | | |
| Example 12 | Orthoperiodic acid | 2.50 | 2-Aminoethylphosphonic acid | 2 | 0.50 | | | | |
| Example 13 | Orthoperiodic acid | 2.50 | Taurine | 2 | 0.23 | | | | |
| Example 14 | Orthoperiodic acid | 2.50 | Glycine | 2 | 0.32 | | | | |
| Example 15 | Metaperiodic acid | 2.50 | 7-Aminoheptanoic acid | 7 | 0.10 | | | | |
| Example 16 | Orthoperiodic acid | 2.50 | 1,8-Octanediamine | 8 | 0.14 | | | | |
| Example 17 | Metaperiodic acid | 2.50 | Aminomethanesulfonic acid | 1 | 0.45 | | | | |
| Example 18 | Orthoperiodic acid | 2.50 | Aminomethanephosphonic acid | 1 | 0.089 | | | | |
| Example 19 | Orthoperiodic acid | 2.50 | Methyl carbamate | 2 | 0.17 | | | | |
| Example 20 | Orthoperiodic acid | 2.50 | Bishexamethylenetriamine | 12 | 0.36 | | | | |
| Example 21 | Orthoperiodic acid | 2.50 | Diethylenetriamine | 4 | 0.21 | | | | |
| Example 22 | Metaperiodic acid | 2.50 | N-Methyl-1,3-propanediamine | 4 | 0.20 | | | | |
| Example 23 | Orthoperiodic acid | 2.50 | 2,2-Dimethyl-1,3-propanediamine | 5 | 0.11 | | | | |
| Example 24 | Orthoperiodic acid | 2.50 | N-Ethylethylenediamine | 4 | 0.09 | | | | |
| Example 25 | Metaperiodic acid | 2.50 | N-(2-aminoethyl)piperazine | 6 | 0.14 | | | | |

| | Makeup of composition | | | Composition | Dissolving ability evaluation | |
|---|---|---|---|---|---|---|
| | Ratio 1 | pH adjuster | Water | pH | Ru | $RuO_2$ |
| Example 1 | 25.0 | Sulfuric acid | Remainder | 4.0 | A | A |
| Example 2 | 12.5 | MSA | Remainder | 5.5 | A | A |
| Example 3 | 10.0 | ETMAH | Remainder | 3.5 | A | A |
| Example 4 | 6.3 | TEAH | Remainder | 4.5 | A | A |
| Example 5 | 5.0 | ETMAH | Remainder | 6.0 | A | A |
| Example 6 | 28.0 | Hydrochloric acid | Remainder | 4.2 | A | A |
| Example 7 | 5.0 | ETMAH | Remainder | 3.7 | A | A |
| Example 8 | 7.1 | TEAH | Remainder | 4.1 | A | A |
| Example 9 | 5.6 | TEAH | Remainder | 6.0 | A | A |
| Example 10 | 16.6 | ETMAH | Remainder | 5.8 | A | A |
| Example 11 | 12.5 | ETMAH | Remainder | 3.7 | A | A |
| Example 12 | 5.0 | TEAH | Remainder | 4.1 | B | B |
| Example 13 | 11.0 | ETMAH | Remainder | 5.7 | B | B |
| Example 14 | 7.9 | ETMAH | Remainder | 3.6 | B | B |
| Example 15 | 24.0 | TEAH | Remainder | 4.6 | B | B |
| Example 16 | 18.0 | Hydrochloric acid | Remainder | 5.1 | B | C |
| Example 17 | 5.6 | ETMAH | Remainder | 5.8 | B | C |
| Example 18 | 28.0 | ETMAH | Remainder | 3.8 | B | C |
| Example 19 | 15.0 | ETMAH | Remainder | 4.0 | B | B |
| Example 20 | 7.0 | Sulfuric acid | Remainder | 4.3 | C | C |
| Example 21 | 12.0 | MSA | Remainder | 5.0 | C | C |
| Example 22 | 12.7 | Phosphoric acid | Remainder | 5.2 | C | C |
| Example 23 | 23.0 | Hydrochloric acid | Remainder | 3.9 | C | C |
| Example 24 | 29.0 | Sulfuric acid | Remainder | 4.6 | C | C |
| Example 25 | 18.5 | Hydrochloric acid | Remainder | 3.5 | C | C |

TABLE 2

| Table 1 (continued) | Makeup of composition | | | | |
|---|---|---|---|---|---|
| | Periodic acid compound | | Specific amine | | |
| | Type | Amount [%] | Type | Number of carbon atoms | Amount [%] |
| Example 26 | Orthoperiodic acid | 2.50 | 1,3-Propanediamine | 3 | 0.071 |
| Example 27 | Orthoperiodic acid | 2.50 | 1,4-Butanediamine | 4 | 0.063 |
| Example 28 | Orthoperiodic acid | 2.50 | 4-Aminobutyric acid | 4 | 0.056 |
| Example 29 | Orthoperiodic acid | 2.50 | 1,3-Propanediamine | 3 | 0.83 |
| Example 30 | Orthoperiodic acid | 2.50 | 1,4-Butanediamine | 4 | 0.63 |
| Example 31 | Orthoperiodic acid | 2.50 | 4-Aminobutyric acid | 4 | 0.52 |
| Example 32 | Orthoperiodic acid | 2.50 | 1,3-Propanediamine | 3 | 0.13 |
| Example 33 | Orthoperiodic acid | 2.50 | 1,4-Butanediamine | 4 | 0.50 |
| Example 34 | Orthoperiodic acid | 2.50 | 4-Aminobutyric acid | 4 | 0.20 |
| Example 35 | Orthoperiodic acid | 2.50 | Succinic acid amide | 4 | 0.10 |
| Example 36 | Orthoperiodic acid | 2.50 | 1,3-Propanediamine | 3 | 0.045 |
| Example 37 | Orthoperiodic acid | 2.50 | 1,4-Butanediamine | 4 | 0.040 |
| Example 38 | Orthoperiodic acid | 2.50 | 4-Aminobutyric acid | 4 | 0.032 |
| Example 39 | Orthoperiodic acid | 2.50 | Succinic acid amide | 4 | 0.026 |
| Example 40 | Orthoperiodic acid | 2.50 | 1,3-Propanediamine | 3 | 2.08 |
| Example 41 | Orthoperiodic acid | 2.50 | 1,4-Butanediamine | 4 | 1.25 |
| Example 42 | Orthoperiodic acid | 2.50 | 4-Aminobutyric acid | 4 | 0.96 |
| Example 43 | Orthoperiodic acid | 2.50 | Succinic acid amide | 4 | 1.04 |
| Example 44 | Orthoperiodic acid | 2.50 | 1,3-Propanediamine | 3 | 0.50 |
| Example 45 | Orthoperiodic acid | 2.50 | 1,4-Butanediamine | 4 | 0.10 |
| Example 46 | Orthoperiodic acid | 2.50 | 4-Aminobutyric acid | 4 | 0.17 |
| Example 47 | Orthoperiodic acid | 2.50 | Succinic acid amide | 4 | 0.18 |
| Example 48 | Orthoperiodic acid | 2.50 | 1,3-Propanediamine | 3 | 0.23 |
| Example 49 | Orthoperiodic acid | 2.50 | 1,3-Propanediamine | 3 | 0.024 |
| Example 50 | Orthoperiodic acid | 2.50 | 1,4-Butanediamine | 4 | 0.021 |

| Table 1 (continued) | Makeup of composition | | | Composition | Dissolving ability evaluation | |
|---|---|---|---|---|---|---|
| | Ratio 1 | pH adjuster | Water | pH | Ru | $RuO_2$ |
| Example 26 | 35.0 | MSA | Remainder | 5.5 | A | A |
| Example 27 | 40.0 | p-Toluenesulfonic acid | Remainder | 3.6 | A | B |
| Example 28 | 45.0 | ETMAH | Remainder | 4.5 | B | B |
| Example 29 | 3.0 | ETMAH | Remainder | 5.0 | A | B |
| Example 30 | 4.0 | TEAH | Remainder | 4.0 | A | B |
| Example 31 | 4.8 | Hydrochloric acid | Remainder | 6.0 | A | B |
| Example 32 | 20.0 | Phosphoric acid | Remainder | 6.5 | A | B |
| Example 33 | 5.0 | Sulfuric acid | Remainder | 7.1 | B | B |
| Example 34 | 12.5 | ETMAH | Remainder | 6.3 | A | B |
| Example 35 | 25.0 | TEAH | Remainder | 7.9 | B | B |
| Example 36 | 55.0 | MSA | Remainder | 4.2 | B | C |
| Example 37 | 63.0 | Phosphoric acid | Remainder | 5.8 | B | C |
| Example 38 | 79.0 | ETMAH | Remainder | 3.6 | B | C |
| Example 39 | 98.0 | TEAH | Remainder | 4.8 | C | C |
| Example 40 | 1.2 | ETMAH | Remainder | 5.0 | B | C |
| Example 41 | 2.0 | Sulfuric acid | Remainder | 6.0 | B | C |
| Example 42 | 2.6 | TEAH | Remainder | 3.5 | B | C |
| Example 43 | 2.4 | ETMAH | Remainder | 4.8 | B | C |
| Example 44 | 5.0 | p-Toluenesulfonic acid | Remainder | 8.1 | B | C |
| Example 45 | 25.0 | MSA | Remainder | 9.5 | B | C |
| Example 46 | 15.0 | ETMAH | Remainder | 10.0 | B | C |
| Example 47 | 14.0 | TEAH | Remainder | 8.5 | B | C |
| Example 48 | 11.0 | ETMAH | Remainder | 9.8 | B | C |
| Example 49 | 105.0 | Hydrochloric acid | Remainder | 4.0 | C | C |
| Example 50 | 120.0 | Nitric acid | Remainder | 5.5 | C | C |

TABLE 3

| Table 1 (continued) | Makeup of composition | | | | |
|---|---|---|---|---|---|
| | Periodic acid compound (Oxidant) | | Specific amine (Additive) | | |
| | Type | Amount [%] | Type | Number of carbon atoms | Amount [%] |
| Example 51 | Orthoperiodic acid | 2.50 | 4-Aminobutyric acid | 4 | 0.020 |
| Example 52 | Orthoperiodic acid | 2.50 | 1,3-Propanediamine | 3 | 2.78 |
| Example 53 | Orthoperiodic acid | 2.50 | 1,4-Butanediamine | 4 | 25.00 |
| Example 54 | Orthoperiodic acid | 2.50 | 4-Aminobutyric acid | 4 | 6.25 |
| Example 55 | Orthoperiodic acid | 2.50 | 1,3-Propanediamine | 3 | 0.50 |
| Example 56 | Orthoperiodic acid | 2.50 | 1,4-Butanediamine | 4 | 0.10 |
| Example 57 | Orthoperiodic acid | 2.50 | 4-Aminobutyric acid | 4 | 0.17 |
| Example 58 | Orthoperiodic acid | 2.50 | 1,3-Propanediamine | 3 | 0.18 |
| Example 59 | Orthoperiodic acid | 2.50 | 1,4-Butanediamine | 4 | 0.23 |
| Example 60 | Orthoperiodic acid | 8.00 | 1,3-Propanediamine | 3 | 0.40 |
| Example 61 | Orthoperiodic acid | 0.50 | 1,3-Propanediamine | 3 | 0.03 |
| Example 62 | Orthoperiodic acid | 2.50 | Urea | 1 | 0.17 |
| Comparative Example 1 | Orthoperiodic acid | 3.00 | — | — | — |
| Comparative Example 2 | — | — | 1,3-Propanediamine | 3 | 5.00 |
| Comparative Example 3 | Orthoperiodic acid | 2.50 | — | — | — |
| Comparative Example 4 | Orthoperiodic acid | 3.00 | — | — | — |
| Comparative Example 5 | Orthoperiodic acid | 3.00 | Diglycolamine | 4 | 0.40 |
| Comparative Example 6 | Orthoperiodic acid | 2.00 | Monoethanolamine | 2 | 0.20 |
| Comparative Example 7 | Sodium hypochlorite | 5.00 | — | — | — |
| Comparative Example 8 | Sodium hypochlorite | 7.00 | 4-Aminobutyric acid | 4 | 2.00 |
| Comparative Example 9 | Orthoperiodic acid | 4.00 | 1,3-Propanediamine | 3 | 1.00 |
| Comparative Example 10 | Orthoperiodic acid | 3.00 | Succinic acid | 4 | 0.50 |
| Comparative Example 11 | Orthoperiodic acid | 2.50 | Aniline | 6 | 0.40 |
| Comparative Example 12 | Orthoperiodic acid | 2.50 | 2,4,6-Trimethylaniline | 9 | 0.50 |
| Comparative Example 13 | Orthoperiodic acid | 10.00 | — | — | — |

| Table 1 (continued) | Makeup of composition | | | Composition | Dissolving ability evaluation | |
|---|---|---|---|---|---|---|
| | Ratio 1 | pH adjuster | Water | pH | Ru | RuO$_2$ |
| Example 51 | 125.0 | ETMAH | Remainder | 3.5 | C | C |
| Example 52 | 0.9 | TEAH | Remainder | 4.5 | C | C |
| Example 53 | 0.1 | TEAH | Remainder | 6.0 | C | C |
| Example 54 | 0.4 | p-Toluenesulfonic acid | Remainder | 4.2 | C | C |
| Example 55 | 5.0 | p-Toluenesulfonic acid | Remainder | 10.5 | C | C |
| Example 56 | 25.0 | Sulfuric acid | Remainder | 12.5 | C | C |
| Example 57 | 15.0 | ETMAH | Remainder | 2.5 | C | C |
| Example 58 | 14.0 | ETMAH | Remainder | 1.0 | C | C |
| Example 59 | 11.0 | TEAH | Remainder | 3.2 | C | C |
| Example 60 | 20.0 | Hydrochloric acid | Remainder | 5.0 | A | A |
| Example 61 | 15.0 | Sulfuric acid | Remainder | 4.5 | A | A |
| Example 62 | 15.0 | ETMAH | Remainder | 4.0 | B | C |
| Comparative Example 1 | — | — | Remainder | 1.5 | D | D |
| Comparative Example 2 | — | — | Remainder | 8.7 | D | D |
| Comparative Example 3 | — | TEAH | Remainder | 3.0 | D | D |
| Comparative Example 4 | — | ETMAH | Remainder | 8.0 | D | D |
| Comparative Example 5 | 7.5 | — | Remainder | 4.5 | C | D |
| Comparative Example 6 | 10.0 | — | Remainder | 2.2 | C | D |
| Comparative Example 7 | — | — | Remainder | 11.0 | D | D |
| Comparative Example 8 | — | — | Remainder | 10.0 | D | D |

TABLE 3-continued

| | | | | | | |
|---|---|---|---|---|---|---|
| Comparative Example 9 | 4.0 | — | Remainder | 4.0 | D | D |
| Comparative Example 10 | 6.0 | — | Remainder | 6.0 | D | D |
| Comparative Example 11 | 6.3 | — | Remainder | 6.0 | D | D |
| Comparative Example 12 | 5.0 | — | Remainder | 5.0 | D | D |
| Comparative Example 13 | — | — | Remainder | 1.1 | C | D |

From the results shown in the table, it has been confirmed that the composition according to the embodiment of the present invention has an excellent dissolving ability for both the Ru-containing layer and RuO$_2$-containing layer.

Especially, it has been confirmed that the dissolving ability for an Ru-containing substance is further improved in a case where the specific amine has 1 to 8 carbon atoms (comparison of Examples 1 to 25), the dissolving ability for a RuO$_2$-containing substance is further improved in a case where the specific amine has 2 to 7 carbon atoms (comparison of Examples 1 to 19), and the dissolving ability for a Ru-containing substance and a RuO$_2$-containing substance is further improved in a case where the specific amine has 3 to 6 carbon atoms (comparison of Examples 1 to 11).

It has been confirmed that the dissolving ability for a Ru-containing substance is further improved in a case where the ratio (ratio 1) of the content of the periodic acid compound to the content of the specific amine is 95 or less (comparison between Example 38 and Example 39), the dissolving ability for a RuO2-containing substance is further improved in a case where the ratio 1 is 50 or less (comparison between Example 28 and Example 36), the dissolving ability for a Ru-containing substance is even further improved in a case where the ratio 1 is less than 45 (comparison between Example 27 and Example 28), and the dissolving ability for a RuO$_2$-containing substance is even further improved in a case where the ratio 1 is less than 40 (comparison between Example 26 and Example 27).

In addition, it has been confirmed that the dissolving ability for a Ru-containing substance is further improved in a case where the ratio 1 is 1 or more (comparison between Example 40 and Example 52), the dissolving ability for a Ru-containing substance and a RuO$_2$-containing substance is further improved in a case where the ratio 1 is 3 or more (comparison between Example 29 and Example 42), and the dissolving ability for a RuO$_2$-containing substance is even further improved in a case where the ratio 1 is 5 or more (comparison of Examples 5 and 7 and Example 31).

It has been confirmed that the dissolving ability for a Ru-containing substance is further improved in a case where the pH of the composition is 10.0 or less (comparison between Example 46 and Example 55), the dissolving ability for a RuO$_2$-containing substance is further improved in a case where the pH of the composition is 8.0 or less (comparison between Example 35 and Example 44), the dissolving ability for a Ru-containing substance is even further improved in a case where the pH of the composition is 7.0 or less (comparison between Example 32 and Example 33), and the dissolving ability for a RuO$_2$-containing substance is even further improved in a case where the pH of the composition is 6.0 or less (comparison between Examples 5 and 9 and Example 34).

Furthermore, it has been confirmed that the dissolving ability for a Ru-containing substance and the dissolving ability for a RuO$_2$-containing substance are further improved in a case where the pH of the composition is 3.3 or more (comparison between Example 3 and Example 59).

EXPLANATION OF REFERENCES

10a: wiring board not yet being subjected to recess etching treatment for wiring line
10b: wiring board having undergone recess etching treatment for wiring line
12: interlayer insulating film
14: barrier metal layer
16: wiring line as removal target
18: recess portion
20, 30: object to be treated
22: substrate
24: film as removal target
26: outer edge portion
32: substrate
34: film as removal target
36: etching stop layer
38: interlayer insulating film
40: metal hard mask
42: hole
44: inner wall
44a: cross-sectional wall
44b: bottom wall
46: dry etching residue

What is claimed is:

1. A composition comprising:
a periodic acid compound selected from the group consisting of a periodic acid and a salt thereof;
an amine compound which is a compound represented by the following Formula (1) or a salt thereof; and
water,
wherein a ratio of a content of the periodic acid compounds to a content of the amine compound is 0.01 or more and less than 45 as a mass ratio, $$R—NH_2 \qquad \text{Formula (1)}$$

in Formula (1), R represents an aliphatic hydrocarbon group which optionally has a substituent, the substituent is selected from the group consisting of an amino group, a phosphonic acid group, and a sulfo group, the aliphatic hydrocarbon group optionally has at least one linking group selected from the group consisting of —O—, —S— and —NR$_1$— in a carbon chain, R$_1$ represents a hydrogen atom or an aliphatic hydrocarbon group which optionally has a substituent, and the substituent does not include a hydroxy group.

2. The composition according to claim 1,
wherein the composition is a composition for treating a substrate having a substance selected from the group consisting of a ruthenium-containing substance and a ruthenium oxide-containing substance.

3. The composition according to claim 1, wherein the composition is a composition for treating a substrate having a ruthenium-containing substance and a ruthenium oxide-containing substance.

4. The composition according to claim 1, wherein the amine compound has 1 to 8 carbon atoms.

5. The composition according to claim 1, wherein the aliphatic hydrocarbon group represented by R has a substituent group selected from the group consisting of an amino group, a phosphonic acid group, and a sulfo group.

6. The composition according to claim 1, wherein the amine compound is at least one compound selected from the group consisting of 1,3-propanediamine, 1,4-butanediamine, and 1,6-hexanediamine.

7. The composition according to claim 1, wherein the composition has a pH of 10.0 or less.

8. The composition according to claim 1, wherein the composition has a pH of 3.5 or more.

9. The composition according to claim 1, wherein the composition has a pH of 3.5 to 6.0.

10. The composition according to claim 1, wherein the composition substantially does not contain abrasive particles.

11. A method for treating a substrate, comprising: a step A of removing a substance selected from the group consisting of a metal-containing substance and an oxidized metal-containing substance on a substrate by using the composition according to claim 1.

12. The method for treating a substrate according to claim 11, wherein the metal-containing substance includes a ruthenium-containing substance, and the oxidized metal-containing substance includes a ruthenium oxide-containing substance.

13. The method for treating a substrate according to claim 11, wherein the step A is a step A1 of performing a recess etching treatment by using the composition on a wiring line that is disposed on a substrate and consists of a metal-containing substance or an oxidized metal-containing substance, a step A2 of removing a film in an outer edge portion of a substrate by using the composition, the substrate having the film consisting of a metal-containing substance or an oxidized metal-containing substance disposed thereon, a step A3 of removing a metal-containing substance or an oxidized metal-containing substance attached to a back surface of a substrate by using the composition, the substrate having a film consisting of a metal-containing substance or an oxidized metal-containing substance disposed thereon, a step A4 of removing a metal-containing substance or an oxidized metal-containing substance on a substrate having undergone dry etching by using the composition, or a step A5 of removing a metal-containing substance or an oxidized metal-containing substance on a substrate having undergone chemical mechanical polishing by using the composition.

14. The method for treating a substrate according to claim 11, further comprising: an oxidation treatment step of bringing an oxidant into contact with the metal-containing substance on the substrate, wherein the step A is performed on the substrate having at least an oxidized metal-containing substance manufactured by the oxidation treatment step.

15. A composition comprising: a periodic acid compound selected from the group consisting of a periodic acid and a salt thereof; an amine compound selected from the group consisting of 1,3-propanediamine, 1,4-butanediamine, 1,6-hexanediamine, succinic acid amide, malonamide, propanamide, butyramide, and adipamide; and water, wherein the composition substantially does not contain abrasive particles.

16. A composition comprising: a periodic acid compound selected from the group consisting of a periodic acid and a salt thereof; an amine compound which is a compound represented by the following Formula (1) or a salt thereof; and water, wherein the composition has a pH of 6.0 or less, $$R-NH_2 \qquad \text{Formula (1)}$$

in Formula (1), R represents an aliphatic hydrocarbon group which optionally has a substituent, the substituent is selected from the group consisting of an amino group, a phosphonic acid group, and a sulfo group, the aliphatic hydrocarbon group optionally has at least one linking group selected from the group consisting of —O—, —S— and —NR$_1$— in a carbon chain, R$_1$ represents a hydrogen atom or an aliphatic hydrocarbon group which optionally has a substituent, and the substituent does not include a hydroxy group.

17. A method for treating a substrate, comprising: a step A of removing a ruthenium-containing substance on a substrate by using a composition comprising: a periodic acid compound selected from the group consisting of a periodic acid and a salt thereof; an amine compound which is a compound represented by the following Formula (1) or a salt thereof; and water, $$R-NH_2 \qquad \text{Formula (1)}$$

in Formula (1), R represents an aliphatic hydrocarbon group which optionally has a substituent, the substituent is selected from the group consisting of an amino group, a phosphonic acid group, and a sulfo group, the aliphatic hydrocarbon group optionally has at least one linking group selected from the group consisting of —O—, —S— and —NR$_1$— in a carbon chain, R$_1$ represents a hydrogen atom or an aliphatic hydrocarbon group which optionally has a substituent, and the substituent does not include a hydroxy group.

* * * * *